(12) United States Patent
Hwang et al.

(10) Patent No.: US 12,376,304 B2
(45) Date of Patent: Jul. 29, 2025

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Yoonjo Hwang, Gimpo-si (KR); Jiyoung Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 522 days.

(21) Appl. No.: 17/828,960

(22) Filed: May 31, 2022

(65) Prior Publication Data
US 2023/0083114 A1    Mar. 16, 2023

(30) Foreign Application Priority Data
Sep. 13, 2021    (KR) .................. 10-2021-0121944

(51) Int. Cl.
*H10B 43/27*    (2023.01)
*H01L 23/522*   (2006.01)
(Continued)

(52) U.S. Cl.
CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ............. H01L 2224/0502–05027; H01L 2224/05073–0509; H01L 2224/0557; H01L 2224/08145–08146; H01L 23/481; H01L 2224/05009; H01L 23/522–53295; H10B 41/20–30; H10B 41/40–50;
(Continued)

(56) References Cited

U.S. PATENT DOCUMENTS 10,354,987 B1 *  7/2019  Mushiga ............. H01L 24/80
10,546,814 B2    1/2020  Tak et al.
(Continued)

FOREIGN PATENT DOCUMENTS

KR         20200064256 A  *  6/2020

*Primary Examiner* — Julio J Maldonado
*Assistant Examiner* — Eric Manuel Mulero Flores
(74) *Attorney, Agent, or Firm* — Myers Bigel, P.A.

(57) ABSTRACT

A semiconductor device includes a first substrate structure including a substrate, circuit devices, and first bonding metal layers on the circuit devices, and a second substrate structure connected to the first substrate structure on the first substrate structure, wherein the second substrate structure includes a plate layer having a first region and a second region, gate electrodes stacked below the plate layer and extending by different lengths in a second direction in the second region, channel structures penetrating the gate electrodes and each including a channel layer, in the first region, input/output contact structures penetrating the plate layer and the gate electrodes and each including a contact conductive layer, in the second region, and second bonding metal layers connected to the first bonding metal layers, wherein a level of upper surfaces of the input/output contact structures is higher than a level of upper surfaces of the channel structures.

20 Claims, 25 Drawing Sheets

(51) Int. Cl.
  *H01L 23/528* (2006.01)
  *H10B 41/10* (2023.01)
  *H10B 41/27* (2023.01)
  *H10B 41/35* (2023.01)
  *H10B 43/10* (2023.01)
  *H10B 43/35* (2023.01)

(58) Field of Classification Search
  CPC ........ H10B 43/20–30; H10B 43/40–50; H10B 80/00; G11C 16/06–3495
  See application file for complete search history.

(56) References Cited

U.S. PATENT DOCUMENTS

| | | |
|---|---|---|
| 10,734,371 B2 | 8/2020 | Park |
| 2017/0179154 A1* | 6/2017 | Furihata ................ H10D 89/911 |
| 2020/0152573 A1 | 5/2020 | Oh et al. |
| 2020/0295043 A1* | 9/2020 | Nishida .................. H10B 43/10 |
| 2021/0035887 A1 | 2/2021 | Chen et al. |
| 2021/0057427 A1 | 2/2021 | Oh |
| 2021/0082877 A1 | 3/2021 | Uchiyama |
| 2021/0383874 A1* | 12/2021 | Oh ......................... H10B 43/27 |
| 2022/0173119 A1 | 6/2022 | Choi et al. |

\* cited by examiner

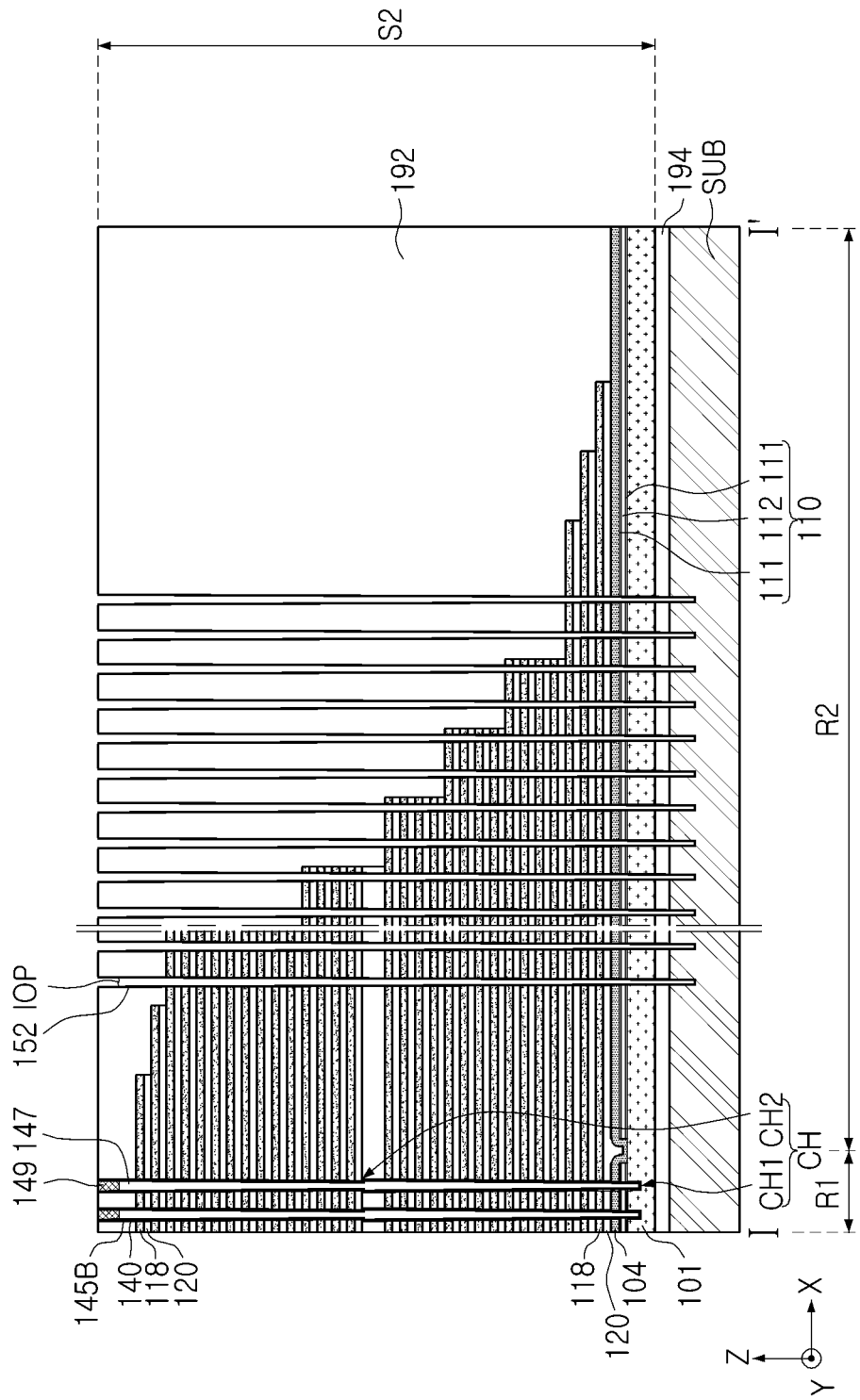

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2021-0121944 filed on Sep. 13, 2021 in the Korean Intellectual Property Office, the disclosure of which is incorporated herein by reference in its entirety.

BACKGROUND

Example embodiments of the present disclosure relate to a semiconductor device and a data storage system including the same.

There is increased demand for semiconductor devices which store high-capacity data in data storage systems. Various ways for increasing the data storage capacity of semiconductor devices have been studied. For example, one conventional method of increasing the data storage capacity of a semiconductor device involves arranging memory cells three-dimensionally, instead of two-dimensionally.

SUMMARY

An example embodiment of the present disclosure is to provide a semiconductor device having improved integration density.

An example embodiment of the present disclosure is to provide a data storage system including a semiconductor device having improved integration density.

According to an example embodiment of the present disclosure, a semiconductor device includes a first substrate structure including a substrate, circuit devices on the substrate, a first interconnection structure electrically connected to the circuit devices, and first bonding metal layers on the first interconnection structure, and a second substrate structure on and electrically connected to the first substrate structure, wherein the second substrate structure includes a plate layer having a first region and a second region, gate electrodes stacked below the plate layer and spaced apart from each other in a first direction that is perpendicular to a lower surface of the plate layer, wherein the gate electrodes extend in a second direction in the second region, wherein the second direction is perpendicular to the first direction, and wherein at least some of the gate electrodes have different lengths, channel structures in the first region, the channel structures penetrating through the gate electrodes in the first direction, wherein each channel structure comprises a channel layer, input/output contact structures in the second region, the input/output contact structures penetrating through the plate layer and the gate electrodes in the first direction, wherein each input/output structure comprises a contact conductive layer, input/output pad structures in the second region and electrically connected to the input/output contact structures, a second interconnection structure below the second region, wherein the second interconnection structure includes gate contacts electrically connected to the gate electrodes, wherein the gate contacts extend in the first direction, and second bonding metal layers below the second interconnection structure and electrically connected to the first bonding metal layers.

According to an example embodiment of the present disclosure, a semiconductor device includes a first substrate structure including a substrate, circuit devices on the substrate, and first bonding metal layers electrically connected to the circuit devices, and a second substrate structure on and electrically connected to the first substrate structure, wherein the second substrate structure includes a plate layer having a first region and a second region, gate electrodes stacked below the plate layer and spaced apart from each other in a first direction that is perpendicular to a lower surface of the plate layer, wherein the gate electrodes have different lengths and extend in a second direction in the second region, wherein the second direction is perpendicular to the first direction, channel structures in the first region, the channel structures penetrating through the gate electrodes in the first direction, wherein each channel structure includes a channel layer, in the first region, input/output contact structures in the second region, the input/output structures penetrating through the plate layer and the gate electrodes in the first direction, wherein each input/output structure includes a contact conductive layer, and second bonding metal layers below the gate electrodes and electrically connected to the first bonding metal layers, wherein a level of upper surfaces of the input/output contact structures is higher than a level of upper surfaces of the channel structures.

According to an example embodiment of the present disclosure, a data storage system includes a semiconductor storage device including a first substrate structure including circuit devices and first bonding metal layers, a second substrate structure including channel structures and second bonding metal layers electrically connected to the first bonding metal layers, and an input/output pad electrically connected to the circuit devices, and a controller electrically connected to the semiconductor storage device through the input/output pad, the controller configured to control the semiconductor storage device, wherein the second substrate structure further includes a plate layer having a first region and a second region, gate electrodes stacked below the plate layer and spaced apart from each other in a first direction that is perpendicular to a lower surface of the plate layer, wherein the gate electrodes extend in a second direction in the second region, wherein the second direction is perpendicular to the first direction, and wherein at least some of the gate electrodes have different lengths, and input/output contact structures in the second region, the input/output contact structures penetrating through the plate layer and the gate electrodes in the first direction, wherein each input/output contact structure includes a contact conductive layer, wherein a level of upper surfaces of the input/output contact structures is higher than a level of upper surfaces of the channel structures.

BRIEF DESCRIPTION OF DRAWINGS

The above and other aspects, features, and advantages of the present disclosure will be more clearly understood from the following detailed description, taken in combination with the accompanying drawings, in which:

FIGS. 8A to 8K are cross-sectional views illustrating a method of manufacturing a semiconductor device according to an example embodiment of the present disclosure;

DETAILED DESCRIPTION

Hereinafter, embodiments of the present disclosure will be described as follows with reference to the accompanying drawings.

Figure 1:
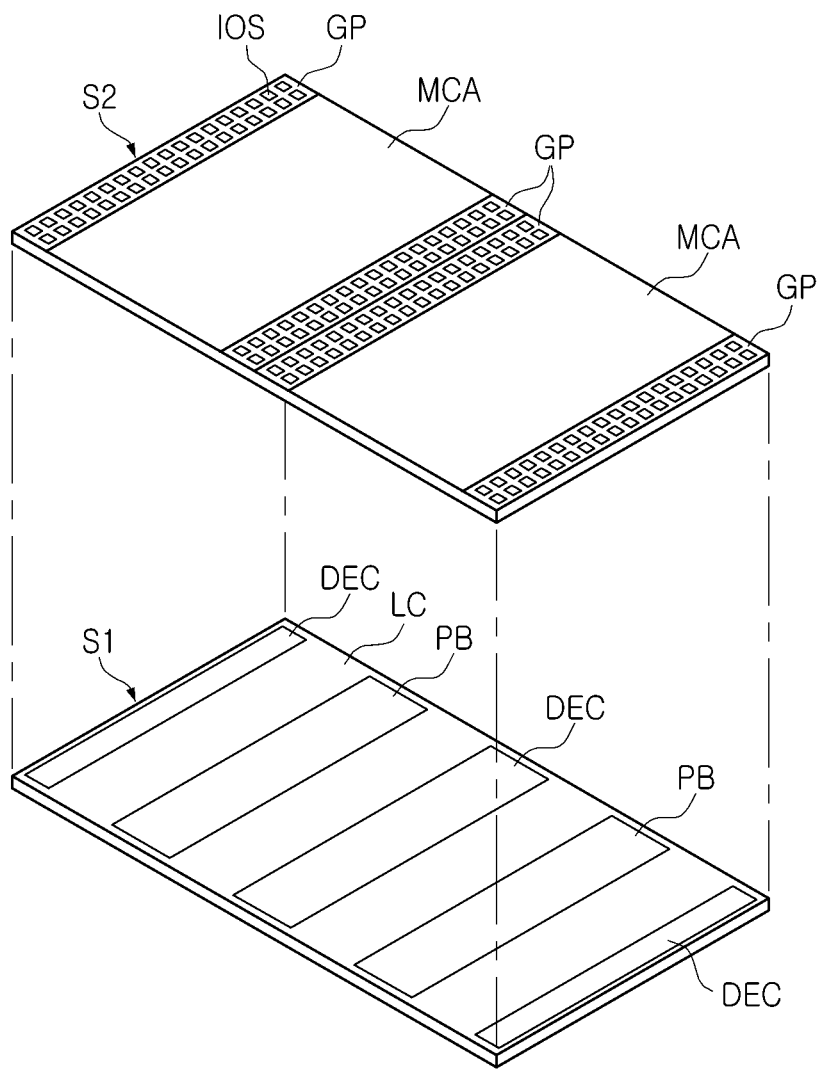
FIG. 1 is a layout view illustrating the arrangement of a semiconductor device according to an example embodiment of the present disclosure.

FIG. 1 is a layout view illustrating an arrangement of a semiconductor device according to an example embodiment.

Referring to FIG. 1, a semiconductor device 10 may include first and second substrate structures S1 and S2 stacked in a vertical direction. The first substrate structure S1 may be a peripheral circuit region and may include a row decoder DEC, a page buffer PB, and a logic circuit LC. The second substrate structure S2 may be a memory cell region and may include memory cell arrays MCA, gate connection regions GP, and input/output pad structures IOS.

In the first substrate structure S1, the row decoder DEC may, by decoding the input address, generate and transmit driving signals of a word line. The page buffer PB may be connected to the memory cell arrays MCA through bit lines and may read data stored in the memory cells. The logic circuit LC may be a region including a control logic and a voltage generator, and may include a latch circuit, a cache circuit, and/or a sense amplifier, for example. The logic circuit LC may further include an electrostatic discharge (ESD) device or a data input/output circuit electrically connected to the input/output pad structures IOS.

At least a portion of the various circuit regions DEC, PB, and LC in the first substrate structure S1 may be disposed below the memory cell arrays MCA of the second substrate structure S2. For example, the page buffer PB and/or the logic circuit LC may be disposed to overlap the memory cell arrays MCA below the memory cell arrays MCA. However, in example embodiments, the circuits included in the first substrate structure S1 and the arrangement form of the circuits may be varied, and accordingly, the circuits overlapping the memory cell arrays MCA may also be varied.

In the second substrate structure S2, the memory cell arrays MCA may be regions in which memory cell strings are disposed, and may be spaced apart from each other. Two memory cell arrays MCA are disposed in the example embodiment, but the number of the memory cell arrays MCA disposed on the second substrate structure S2 and the arrangement form thereof may be varied in example embodiments. The gate connection regions GP may be disposed on at least one side of each of the memory cell arrays MCA. The gate connection regions GP may be regions in which the gate electrodes 130 (see FIGS. 2A and 2B) of the memory cell arrays MCA may extend by different lengths and may be connected to an interconnection structure.

The input/output pad structures IOS may be disposed on the gate connection regions GP. For example, the input/output pad structures IOS may be disposed to form a column on the gate connection regions GP between the memory cell arrays MCA. The input/output pad structures IOS may be configured to transmit electrical signals to and receive electrical signals from an external device. The input/output pad structures IOS may be regions electrically connected to a portion of the circuits disposed in the logic circuit LC of the first substrate structure S1 in the semiconductor device 10. In the example embodiment, the input/output pad structures IOS may be disposed to overlap the gate connection regions GP, such that integration density of the semiconductor device 10 may improve.

Figure 2A:
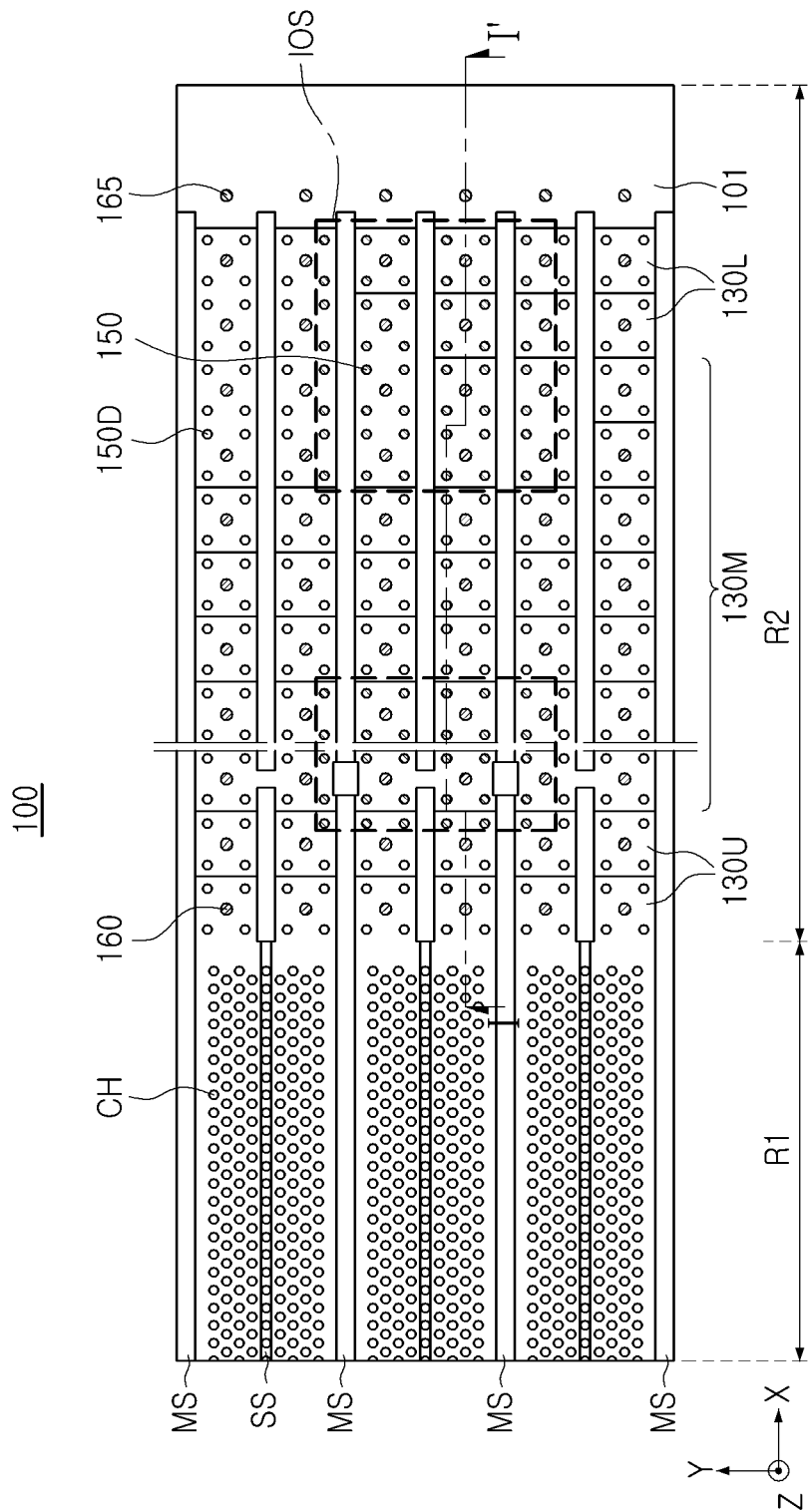
FIGS. 2A and 2B are a plan view (FIG. 2A) and a cross-sectional view (FIG. 2B) illustrating a semiconductor device according to an example embodiment of the present disclosure.
Figure 2B:
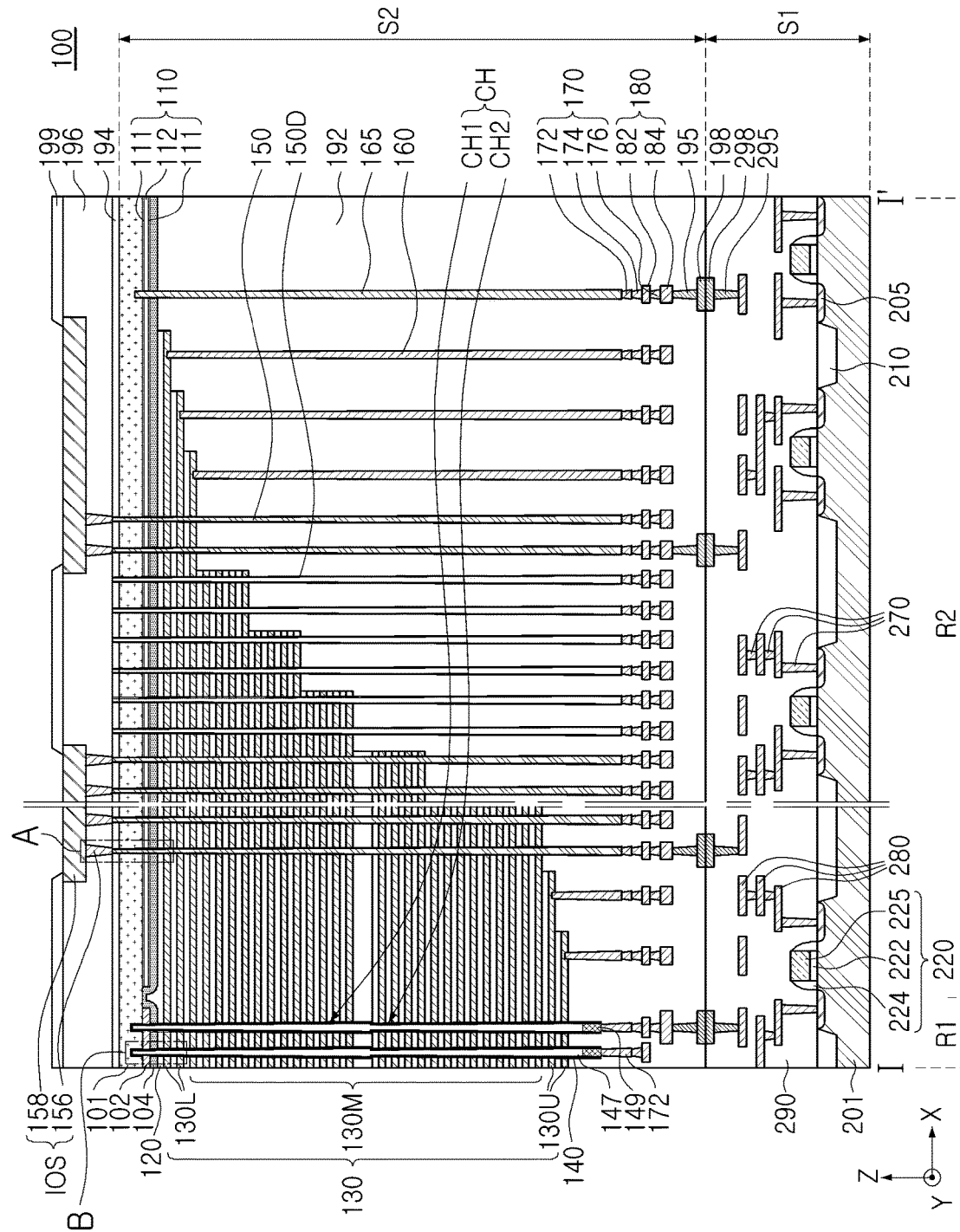

FIGS. 2A and 2B are a plan view and a cross-sectional view illustrating a semiconductor device according to an example embodiment, taken along line I-I' in FIG. 2A.

Figure 3A:
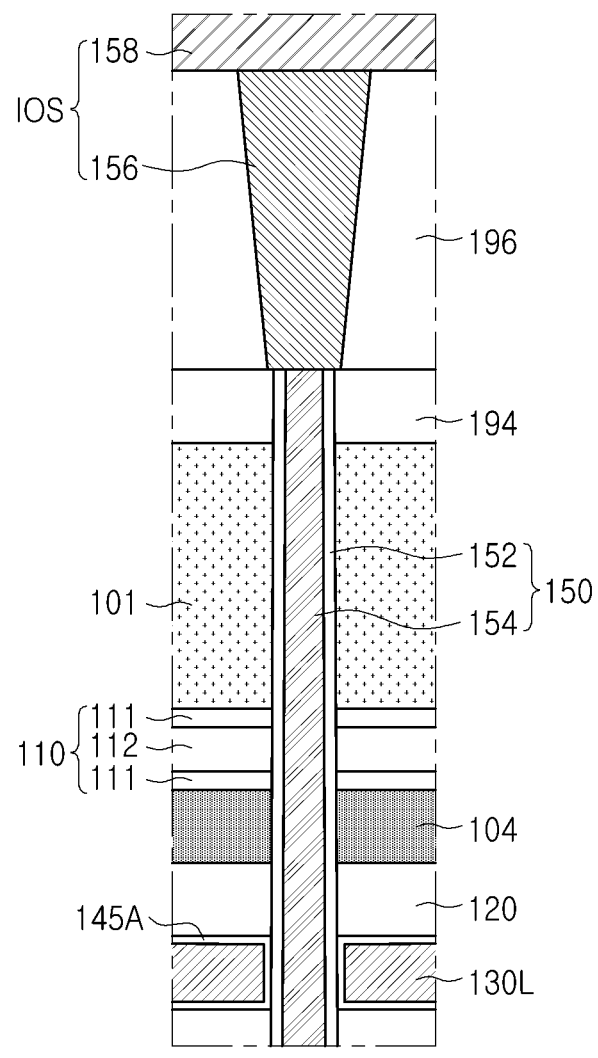
FIGS. 3A and 3B are enlarged views illustrating a portion of a semiconductor device according to an example embodiment of the present disclosure.
Figure 3B:
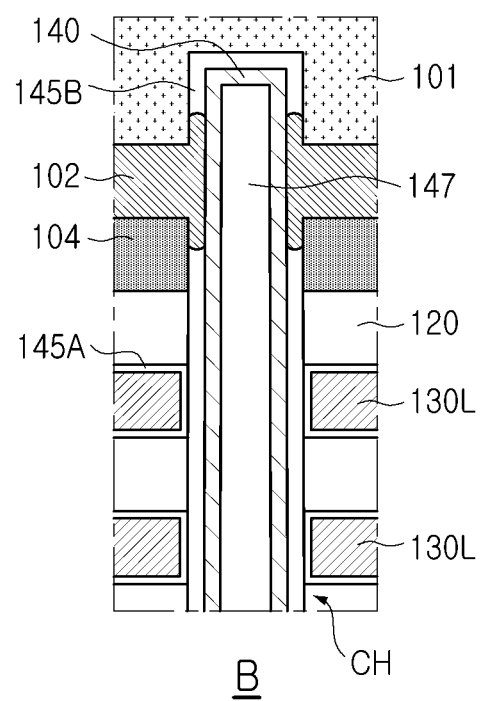

FIGS. 3A and 3B are enlarged views illustrating a portion of a semiconductor device according to an example embodiment. FIG. 3A is an enlarged view illustrating region "A" in FIG. 2B, and FIG. 3B is an enlarged view illustrating region "B" in FIG. 2B.

Referring to FIGS. 2A to 3B, the semiconductor device 100 may include first and second substrate structures S1 and S2 stacked vertically. The first substrate structure S1 may correspond to the first substrate structure S1 in FIG. 1 and may include a peripheral circuit region. The second substrate structure S2 may correspond to the second substrate structure S2 in FIG. 1 and may include a memory cell region. In FIG. 2A, a plane taken in a direction from an interfacial surface between the first and second substrate structures S1 and S2 to the second substrate structure S2 is illustrated.

The first substrate structure S1 may include a substrate 201, source/drain regions 205 and device isolation layers 210 in the substrate 201, and circuit devices 220 disposed on the substrate 201, circuit contact plugs 270, circuit interconnection lines 280, a peripheral region insulating layer 290, first bonding vias 295, and first bonding metal layers 298.

The substrate 201 may have an upper surface extending in the X-direction and the Y-direction. Device isolation layers 210 may be formed on the substrate 201 such that an active region may be defined. The source/drain regions 205 including impurities may be disposed in a portion of the active region. The substrate 201 may include a semiconductor material, such as, for example, a group IV semiconductor, a group III-V compound semiconductor, or a group II-VI compound semiconductor. For example, the substrate 201 may be provided as a single crystal bulk wafer.

The circuit devices 220 may include a planar transistor. Each of the circuit devices 220 may include a circuit gate dielectric layer 222, spacer layers 224, and a circuit gate electrode 225. The source/drain regions 205 may be disposed in the substrate 201 on both sides of the circuit gate electrode 225.

A peripheral region insulating layer 290 may be disposed on the circuit device 220 on the substrate 201. The circuit contact plugs 270 and the peripheral region insulating layer 290 may form a first interconnection structure of the first substrate structure S1. The circuit contact plugs 270 may have a cylindrical shape, may penetrate the peripheral region insulating layer 290, and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit interconnection lines 280 may be connected to the circuit contact plugs 270, may have a linear shape, and may be disposed in a plurality of layers. In example embodiments, the number of layers of the circuit contact plugs 270 and the circuit interconnection lines 280 may be varied.

The first bonding vias 295 and the first bonding metal layers 298 may form a first bonding structure and may be disposed on a portion of the uppermost circuit interconnection lines 280. The first bonding vias 295 may have a cylindrical shape, and the first bonding metal layers 298 may have a linear shape. Upper surfaces of the first bonding metal layers 298 may be exposed to the upper surface of the first substrate structure S1. The first bonding vias 295 and the first bonding metal layers 298 may function as bonding structures or bonding layers of the first substrate structure S1 and the second substrate structure S2. Also, the first bonding vias 295 and the first bonding metal layers 298 may provide an electrical connection path with the second substrate structure S2. In example embodiments, a portion of the first bonding metal layers 298 may not be connected to the circuit interconnection lines 280 disposed therebelow and may be disposed only for bonding. The first bonding vias 295 and the first bonding metal layers 298 may include a conductive material, such as, for example, copper (Cu).

In example embodiments, the peripheral region insulating layer 290 may include a bonding insulating layer having a predetermined thickness from the upper surface. The bonding insulating layer may be provided for dielectric-to-dielectric bonding with the bonding insulating layer of the second substrate structure S2. The bonding insulating layer may also function as a diffusion barrier layer of the first bonding metal layers 298, and may include, for example, at least one of SiO, SiN, SiCN, SiOC, SiON, and SiOCN.

The second substrate structure S2 may include a plate layer 101 having a first region R1 and a second region R2, and first and second horizontal conductive layers 102 and 104 on the lower surface of the plate layer 101, gate electrodes 130 stacked on the lower surfaces of the first and second horizontal conductive layers 102 and 104, and interlayer insulating layers 120 alternately stacked with the gate electrodes 130, separation regions MS penetrating the gate electrodes 130 and extending in one direction, channel structures CH disposed to penetrate the gate electrodes 130 in the first region R1, and input/output contact structures 150 disposed to penetrate the plate layer 101 and the gate electrodes 130. The second substrate structure S2 may further include a horizontal insulating layer 110, upper separation regions SS, dummy contact structures 150D, input/output pad structures IOS connected to input/output contact structures 150, and first to third cell region insulating layers 192, 194, and 196, and a passivation layer 199.

The second substrate structure S2 may include gate contacts 160 connected to the gate electrodes 130 in the second region R2, a substrate contact 165, cell contact plugs 170 and cell interconnection lines 180, as a second interconnection structure. The second substrate structure S2 may be a second bonding structure and may further include second bonding vias 195 and second bonding metal layers 198.

The first region R1 of the plate layer 101 may be a region in which the gate electrodes 130 are vertically stacked and the channel structures CH are disposed, and may be a region in which the memory cells are disposed. The second region R2 of the plate layer 101 may be a region in which the gate electrodes 130 extend by different lengths, and may correspond to a region for electrically connecting the memory cells to the first substrate structure S1. The first region R1 may correspond to the memory cell array MCA in FIG. 1, and the second region R2 may correspond to the gate connection region GP in FIG. 1. The second region R2 may be disposed on at least one end of the first region R1 in at least one direction, such as, for example, the X-direction.

The plate layer 101 may have an upper surface extending in the X-direction and the Y-direction. The plate layer 101 may have a shape continuously extending throughout the entire semiconductor device 100 as illustrated in FIG. 2B. The plate layer 101 may include a conductive material. For example, the plate layer 101 may include a semiconductor material, such as, for example, a group IV semiconductor, a group III-V compound semiconductor, or a group II-VI compound semiconductor. For example, the group IV semiconductor may include silicon, germanium, or silicon-germanium. The plate layer 101 may further include impurities. The plate layer 101 may be provided as a polycrystalline semiconductor layer such as a polycrystalline silicon layer or an epitaxial layer.

The first and second horizontal conductive layers 102 and 104 may be disposed and stacked in order on the lower surface of the first region R1 of the plate layer 101. The first horizontal conductive layer 102 may not extend to the second region R2 of the plate layer 101, and the second horizontal conductive layer 104 may extend to the second region R2. The first horizontal conductive layer 102 may function as a portion of a common source line of the semiconductor device 100, and may, for example, function as a common source line together with the plate layer 101. As illustrated in the enlarged view in FIG. 3B, the first horizontal conductive layer 102 may be directly connected to the channel layer 140 around the channel layer 140.

The second horizontal conductive layer 104 may be in contact with the plate layer 101 in partial regions in which the first horizontal conductive layer 102 and the horizontal insulating layer 110 are not disposed. The second horizontal conductive layer 104 may be bent while covering the end of the first horizontal conductive layer 102 or the horizontal insulating layer 110 in the partial regions and may extend to the lower surface of the plate layer 101.

The first and second horizontal conductive layers 102 and 104 may include a semiconductor material, and for example, the first and second horizontal conductive layers 102 and 104 may both include polycrystalline silicon. In this case, at least the first horizontal conductive layer 102 may be a doped layer, and the second horizontal conductive layer 104 may be a doped layer or a layer including impurities diffused from the first horizontal conductive layer 102. However, the material of the second horizontal conductive layer 104 is not limited to the semiconductor material, and the second horizontal conductive layer 104 may be replaced with an insulating layer.

The horizontal insulating layer 110 may be disposed on the lower surface of the plate layer 101 on a level corresponding to a level of the first horizontal conductive layer 102 in at least a portion of the second region R2. The horizontal insulating layer 110 may include first and second horizontal insulating layers 111 and 112 alternately stacked on the second region R2 of the plate layer 101. The horizontal insulating layer 110 may be layers remaining after a portion of the horizontal insulating layer 110 are replaced with the first horizontal conductive layer 102 in the process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 12

The gate electrodes 130 may be vertically stacked and spaced apart from each other on the lower surface of the plate layer 101 and may form a stack structure together with the interlayer insulating layers 120. The stack structure may be vertically stacked and may include lower and upper stack structures surrounding the first and second channel structures CH1 and CH2, respectively. However, in example embodiments, the stack structure may be configured as a single stack structure.

The gate electrodes 130 may include at least one lower gate electrode 130L forming the gate of the ground select transistor, memory gate electrodes 130M forming the plurality of memory cells, and upper gate electrodes 130U forming the gates of the string select transistors. The lower and upper stack structures, the lower gate electrode 130L, and the upper gate electrodes 130U may be referred to as "lower" and "upper" with reference to the directions during the manufacturing process. The number of memory gate electrodes 130M forming the memory cells may be determined according to capacity of the semiconductor device 100. In example embodiments, the number of each of the upper and lower gate electrodes 130U and 130L may be one to four or more, and the upper and lower gate electrodes 130U and 130L may have a structure the same as or different from that of the memory gate electrodes 130M. In example embodiments, the gate electrodes 130 may further include the gate electrode 130 disposed below the upper gate electrodes 130U and/or on the lower gate electrode 130L and used for an erase operation using a gate induced drain leakage (GIDL) phenomenon. Also, a portion of the gate electrodes 130, that is, for example, the memory gate electrodes 130M adjacent to the upper or lower gate electrodes 130U and 130L may be dummy gate electrodes.

As illustrated in FIG. 2A, the gate electrodes 130 may be separated from each other in the Y-direction by the pair of separation regions continuously extending from the first region R1 and the second region R2 among the separation regions MS. The gate electrodes 130 between the pair of first separation regions MS may form a single memory block, but the example of the memory block is not limited thereto. A portion of the gate electrodes 130, such as, for example, the memory gate electrodes 130M, may form a single layer in a single memory block.

The gate electrodes 130 may be vertically stacked and spaced apart from each other on the first region R1 and the second region R2, and may extend from the first region R1 to the second region R2 by different lengths, and may form a step structure in the form of a staircase in a portion of the second region R2, as illustrated in FIG. 2B. The gate electrodes 130 also may be disposed to have a step structure in the Y-direction. Due to the step structure, the upper gate electrode 130 of the gate electrodes 130 may extend longer than the lower gate electrode 130, and may have regions in which the lower surfaces thereof may be exposed downwardly from the interlayer insulating layers 120 and the other gate electrodes 130, and the above-described regions may be referred to as gate pad regions. In each of the gate electrodes 130, the gate pad region may be a region including the end of the gate electrode 130 in the X-direction. The gate pad region may correspond to a region of the gate electrode 130 disposed in a lowermost portion in each region among the gate electrodes 130 forming the stack structure in the second region R2 of the plate layer 101. The gate electrodes 130 may be connected to the gate contacts 160 in the gate pad regions. In example embodiments, the gate electrodes 130 may have an increased thickness in the gate pad regions.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be disposed to be spaced apart from each other in a direction perpendicular to the lower surface of the plate layer 101 and to extend in the X-direction, as illustrated in FIG. 2B. The interlayer insulating layers 120 may include an insulating material such as silicon oxide or silicon nitride.

The separation regions MS may be disposed to penetrate the gate electrodes 130 and to extend in the X-direction. The separation regions MS may be disposed parallel to each other. The separation regions MS may penetrate the entire gate electrodes 130 stacked on the plate layer 101 and may be connected to the plate layer 101. A portion of the separation regions MS may extend as a single layer in the X-direction, and the other portions may intermittently extend or may be disposed in only a partial region. However, in example embodiments, the arrangement order of the separation regions MS and the number of the separation regions MS are not limited to the examples illustrated in FIG. 2A.

The separation regions MS may have a shape in which a width thereof may decrease toward the plate layer 101 due to a high aspect ratio, but an example embodiment thereof is not limited thereto. The separation regions MS may include an insulating material, such as, for example, silicon oxide, silicon nitride, or silicon oxynitride. In example embodiments, the separation regions MS may further include a conductive layer. In this case, the conductive layer may function as a common source line or a contact plug connected to the common source line of the semiconductor device 100.

As illustrated in FIG. 2A, the upper separation regions SS may extend in the X-direction between the separation regions MS in the first region R1. The upper separation regions SS may be disposed to penetrate a portion of the gate electrodes 130 including the lowermost upper gate electrode 130U among the gate electrodes 130. The upper separation regions SS may separate three gate electrodes 130 from each other in the Y-direction including the upper gate electrodes 130U. However, the number of gate electrodes 130 separated by the upper separation regions SS may be varied in example embodiments. The upper gate electrodes 130U separated by the upper separation regions SS may form different string selection lines. The upper separation regions SS may include an insulating material, such as, for example, silicon oxide, silicon nitride, or silicon oxynitride.

The channel structures CH may be disposed to be spaced apart from each other while forming rows and columns on the lower surface of the plate layer 101 in the first region R1 of the plate layer 101. The channel structures CH may be disposed to form a grid pattern or may be disposed in a zigzag pattern in one direction. The channel structures CH may have a columnar shape, and may have inclined side surfaces such that a width thereof may decrease toward the plate layer 101 depending on an aspect ratio. In example embodiments, a portion of the channel structures CH may be a dummy channel which may not substantially form a memory cell string, and, for example, a portion thereof disposed adjacent to the second region R2 may be a dummy channel.

Each of the channel structures CH may have a form in which the first and second channel structures CH1 and CH2 penetrating the lower and upper stack structures of the gate electrodes 130, respectively, are connected to each other, and may have a bent portion due to a difference or a change in width in the connection region. However, in example embodiments, the number of channel structures stacked in the Z-direction may be varied.

Each of the channel structures CH may include a channel layer 140, first and second gate dielectric layers 145A and 145B, a channel filling insulating layer 147, and a channel pad 149, disposed in a channel hole. As illustrated in the enlarged view in FIG. 3B, the channel layer 140 may be formed in an annular shape surrounding the channel filling insulating layer 147 therein, but in example embodiments, the channel layer 140 may have a columnar shape such as a cylindrical shape or a prism shape without the channel filling insulating layer 147. The channel layer 140 may be connected to the first horizontal conductive layer 102 in a lower portion. The channel layer 140 may include a semiconductor material such as polycrystalline silicon or single crystal silicon.

The first and second gate dielectric layers 145A and 145B may be disposed between the gate electrodes 130 and the channel layer 140. The first gate dielectric layer 145A may extend horizontally along upper and lower surfaces of the gate electrodes 130 and may cover side surfaces of the gate electrodes 130 opposing the channel structure CH. The first gate dielectric layer 145A may also cover side surfaces of the gate electrodes 130 opposing the input/output contact structures 150 and the dummy contact structures 150D. The second gate dielectric layer 145B may extend vertically along the channel layer 140. Although not specifically illustrated, the second gate dielectric layer 145B may include a tunneling layer, a charge storage layer, and a portion of a blocking layer stacked in order from the channel layer 140, and the first gate dielectric layer 145A may include the other portion of the blocking layer. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k material, or a combination thereof.

The channel pad 149 may be disposed only on the lower end of the lower second channel structure CH2. The channel pads 149 may include, for example, doped polycrystalline silicon.

The channel layer 140, the gate dielectric layer 145, and the channel filling insulating layer 147 may be connected to each other between the first channel structure CH1 and the second channel structure CH2. A relatively thick interlayer insulating layer 120 may be further disposed between the first channel structure CH1 and the second channel structure CH2. However, the shapes of the interlayer insulating layers 120 may be varied in the example embodiments.

As illustrated in FIG. 2A, the input/output contact structures 150 and the dummy contact structures 150D may be disposed to be spaced apart from the channel structures CH in the X-direction. The input/output contact structures 150 and the dummy contact structures 150D may be disposed around the gate contacts 160 and may be disposed in a region including a region between the gate contacts 160 adjacent to each other in the X-direction. Specifically, the input/output contact structures 150 and the dummy contact structures 150D may be disposed in a position shifted from the gate contacts 160 in the Y-direction between the gate contacts 160 adjacent to each other in the X-direction. For example, four input/output contact structures 150 and four dummy contact structures 150D may be respectively disposed around (i.e., in adjacent, spaced-apart relationship with) each of the gate contacts 160, but an example embodiment thereof is not limited thereto. A spacing distance from each of the input/output contact structures 150 and the dummy contact structures 150D to the gate contact 160 may be smaller than a spacing distance from each of the input/output contact structures 150 and the dummy contact structures 150D to the channel structure CH. The spacing distances may be, for example, a spacing distance from the most adjacent channel structure CH and a spacing distance from the most adjacent gate contact 160.

The input/output contact structures 150 and the dummy contact structures 150D may be disposed to penetrate the plate layer 101, a horizontal insulating layer 110, a second horizontal conductive layer 104, and the gate electrodes 130 in the second region R2. Since the input/output contact structures 150 and the dummy contact structures 150D are disposed in the second region R2, such that the input/output contact structures 150 and the dummy contact structures 150D may penetrate the region in which the gate electrodes 130 form a staircase structure. The input/output contact structures 150 and the dummy contact structures 150D may have side surfaces such that widths thereof may decrease toward the plate layer. The input/output contact structures 150 and the dummy contact structures 150D may support the stack structure of the interlayer insulating layers 120 in the process of removing sacrificial insulating layers 118 (see FIG. 8F) during a process of manufacturing the semiconductor device 100.

The input/output contact structures 150 may electrically connect the circuit devices 220 of the first substrate structure S1 to the input/output pad structures IOS. The input/output contact structures 150 may be disposed to overlap the input/output pad structures IOS in the Z-direction. The input/output contact structures 150 may have a diameter equal to or greater than that of the channel structures CH. The input/output contact structures 150 may have a diameter equal to or smaller than that of the gate contacts 160. For example, the input/output contact structures 150 may have a diameter in the range of about 80 nm to about 350 nm.

The upper ends or upper surfaces of the input/output contact structures 150 may be disposed on a level higher than a level of the upper surface of the channel structures CH, and may be disposed on the same level as or a level higher than a level of the upper surface of the plate layer 101. The input/output contact structures 150 may penetrate the second cell region insulating layer 194, and the upper ends of the input/output contact structures 150 may be disposed on a level the same as or similar to a level of the upper surface of the second cell region insulating layer 194. However, in some example embodiments, the upper ends of the input/output contact structures 150 may be disposed on substantially the same level as a level of the upper surface of the plate layer 101. The upper ends of the input/output contact structures 150 may be connected to the input/output vias 156.

The lower ends or lower surfaces of the input/output contact structures 150 may be disposed below the plate layer 101. Specifically, the lower ends of the input/output contact structures 150 may be disposed on a level lower than a level of the lower surface of the lowermost upper gate electrode 130U, and may be disposed on a lower level than a level of the lower surfaces of the channel structures CH. The lower ends of the input/output contact structures 150 may be connected to the second interconnection structure.

The input/output contact structures 150 may have an internal structure different from that of the channel structures CH. The input/output contact structures 150 also may have an internal structure different from that of the gate contacts 160, but example embodiments thereof are not limited thereto. As illustrated in FIG. 3A, the internal structure of the input/output contact structure 150 may include a contact conductive layer 154 and a contact insulating layer 152 surrounding (i.e., extending around) side surfaces of the contact conductive layer 154. The contact insulating layer 152 may be disposed to cover a sidewall of a contact hole in which the input/output contact structure 150 is disposed. The contact insulating layer 152 may be disposed to extend in the Z-direction between the contact conductive layer 154 and the gate electrodes 130. The contact insulating layer 152 may include an insulating material, such as, for example, silicon oxide, silicon nitride, or silicon oxynitride. The contact conductive layer 154 may include a conductive material, such as, for example, doped silicon (S1), tungsten (W), aluminum (Al), copper (Cu), tungsten nitride (WN), tantalum nitride (TaN), or titanium nitride. (TiN), or a combination thereof.

The dummy contact structures 150D may be disposed on an external side of the input/output pad structures IOS to not overlap the input/output pad structures IOS in the Z-direction in the second region R2. Differently from the input/output contact structures 150, the dummy contact structures 150D may be electrically separated from the input/output pad structures IOS and may not perform an electrical function in the semiconductor device 100. Upper ends of the dummy contact structures 150D may be covered by a third cell region insulating layer 196. Lower ends of the dummy contact structures 150D may be connected to the second interconnection structure. However, in example embodiments, lower ends of the dummy contact structures 150D may not be connected to the second interconnection structure. In the example embodiment, the dummy contact structures 150D may have the same internal structure as that of the input/output contact structures 150, e.g., a contact conductive layer and a contact insulating layer surrounding (i.e., extending around) side surfaces of the contact conductive layer. However, in the drawings, hatching different from that of the input/output contact structures 150 may be applied to the dummy contact structures 150D to distinguish the dummy contact structures 150D from the input/output contact structures 150.

The input/output pad structures IOS may be disposed on the input/output contact structures 150 in the second region R2. As described above with reference to FIG. 1, since the input/output pad structures IOS are disposed on the second region R2 corresponding to the gate connection regions GP, the input/output pad structures IOS may be spaced apart from the channel structures CH in the X-direction so as not to overlap the channel structures CH in the Z-direction. As shown in FIG. 2A, a plurality of input/output pad structures IOS may be disposed to be spaced apart from each other in the second region R2. However, the arrangement form of the input/output pad structures IOS, the specific arrangement position of the input/output pad structures IOS on the second region R2, the size of the input/output pad structures IOS may be varied in the example embodiments.

The input/output pad structures IOS may include input/output vias 156 on the input/output contact structures 150 and input/output pads 158 on the input/output vias 156. The input/output vias 156 may connect the input/output contact structures 150 to the input/output pads 158. However, in example embodiments, the input/output vias 156 may not be provided. In this case, the input/output contact structures 150 may be directly connected to the input/output pads 158. The input/output pads 158 may be connected to an electrical connection structure, such as a signal transmission medium of a device as a package on which the semiconductor device 100 is mounted, through an upper surface thereof.

The input/output vias 156 and the input/output pads 158 may have inclined side surfaces such that widths thereof may decrease toward the plate layer 101, as illustrated in FIG. 2B. The input/output vias 156 and the input/output pads 158 may have a tapered shape in a direction different from the direction of the input/output contact structures 150, the channel structures CH, and the second interconnection structure. The input/output pad structures IOS may include a metal material, such as, for example, tungsten (W), aluminum (Al), copper (Cu), tungsten nitride (WN), tantalum nitride (TaN), titanium nitride (TiN), or a combination thereof.

In the example embodiment, since the input/output pad structures IOS are disposed on the second region R2 and are connected to the input/output contact structures 150, integration density of the semiconductor device 100 may improve. For example, as compared to the comparative example in which the plate layer 101 is partially removed and the input/output pad structures IOS are disposed on a region in which the gate electrodes 130 are not disposed, the size of the semiconductor device 100 may be further reduced. Also, defects in the process due to the removal of the plate layer 101 may be prevented.

The first cell region insulating layer 192 may be disposed to cover the lower surface of the plate layer 101 and the gate electrodes 130 on the lower surface of the plate layer 101. The second cell region insulating layer 194 may be disposed to cover the upper surface of the plate layer 101. The third cell region insulating layer 196 may be disposed to surround side surfaces of the input/output pad structures IOS. The first to third cell region insulating layers 192, 194, and 196 may be formed of an insulating material, and each of the first to third cell region insulating layers 192, 194, and 196 may include a plurality of insulating layers.

The passivation layer 199 may be disposed on upper surfaces of the input/output pads 158. The passivation layer 199 may function as a layer protecting the semiconductor device 100. The passivation layer 199 may have openings exposing at least a portion of the input/output pads 158. The passivation layer 199 may include an insulating material, such as, for example, at least one of silicon oxide, silicon nitride, and silicon carbide.

The second interconnection structure may include gate contacts 160, a substrate contact 165, cell contact plugs 170, and cell interconnection lines 180, and may allow the second substrate structure S2 to be electrically connected to the first substrate structure S1.

The gate contacts 160 may penetrate the first cell region insulating layer 192 and may be connected to the gate electrodes 130. The substrate contact 165 may be connected to the plate layer 101.

The cell contact plugs 170 may include first to third cell contact plugs 172, 174, and 176, and the cell interconnection lines 180 may include first and second cell interconnection lines 182 and 184. The channel pads 149, the input/output contact structures 150, the dummy contact structures 150D, the gate contacts 160, and the substrate contact 165 may be connected to the first cell contact plugs 172 on the lower end thereof. The first cell contact plugs 172 may be connected to the second cell contact plugs 174 on the lower end, and the second cell contact plugs 174 may be connected to the first cell interconnection lines 182 on the lower end. The third cell contact plugs 176 may vertically connect the first and second cell interconnection lines 182 and 184 to each other. Each of the cell contact plugs 170 may have a cylindrical shape. The cell contact plugs 170 may have different lengths. For example, the first cell contact plugs 172 may have a relatively long length. In example embodiments, the cell contact plugs 170 may have inclined side surfaces such that widths thereof may decrease toward the plate layer 101 and may increase toward the first substrate structure S1 depending on an aspect ratio. In example embodiments, a portion of the cell contact plugs 170 may be dummy contact plugs to which an electrical signal is not applied.

The first cell interconnection lines 182 may include bit lines of the first region R1 connected to the channel structures CH and interconnection lines of the second region R2 disposed on the same level as a level of the bit lines. The second cell interconnection lines 184 may be interconnection lines disposed below the first cell interconnection lines 182. The cell interconnection lines 180 may have a linear shape extending in at least one direction. In example embodiments, the second cell interconnection lines 184 may have a thickness greater than that of the first cell interconnection lines 182. The cell interconnection lines 180 may have inclined side surfaces such that widths thereof may decrease toward the plate layer 101.

The gate contacts 160, the substrate contact 165, the cell contact plugs 170, and the cell interconnection lines 180 may include, for example, tungsten (W), aluminum (Al), copper (Cu), tungsten nitride (WN), tantalum nitride (TaN), titanium nitride (TiN), or a combination thereof.

The second bonding vias 195 of the second bonding structure may be disposed below the second cell interconnection lines 184 and may be connected to the second cell interconnection lines 184, and the second bonding metal layers 198 of the second bonding structure may be connected to the second bonding vias 195. A lower surface of the second bonding metal layers 198 may be exposed to a lower surface of the second substrate structure S2. The second bonding metal layers 198 may be bonded to and connected to the first bonding metal layers 298 of the first substrate structure S1. The second bonding vias 195 and the second bonding metal layers 198 may include a conductive material, such as, for example, copper (Cu).

In example embodiments, the first cell region insulating layer 192 may include a bonding insulating layer having a predetermined thickness from the lower surface. In this case, the bonding insulating layer may form dielectric-to-dielectric bonding with the bonding insulating layer of the first substrate structure S1. The bonding insulating layer may include at least one of SiO, SiN, SiCN, SiOC, SiON, and SiOCN, for example.

The first and second substrate structures S1 and S2 may be bonded to each other by bonding the first bonding metal layers 298 to the second bonding metal layers 198 and bonding the bonding insulating layers to each other. The bonding between the first bonding metal layers 298 and the second bonding metal layers 198 may be, for example, copper (Cu)-to-copper (Cu) bonding, and the bonding between the bonding insulating layers may be, for example, dielectric-to-dielectric bonding such as SiCN-to-SiCN bonding. The first and second substrate structures S1 and S2 may be bonded by hybrid bonding including copper (Cu)-to-copper (Cu) bonding and dielectric-to-dielectric bonding.

Figure 4A:
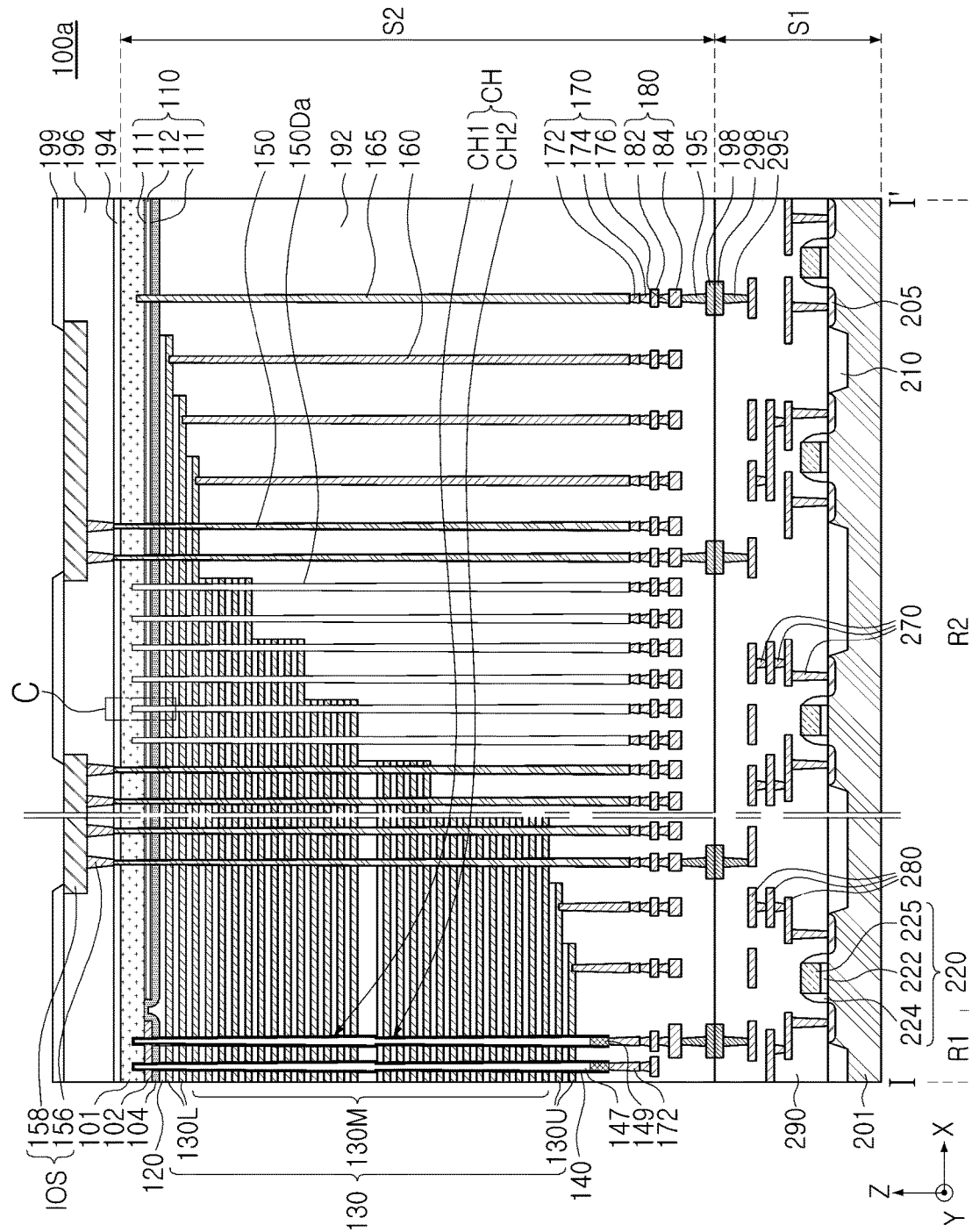
FIGS. 4A and 4B are a cross-sectional view (FIG. 4A) illustrating a semiconductor device and an enlarged view (FIG. 4B) illustrating a portion of a semiconductor device according to an example embodiment of the present disclosure, respectively.
Figure 4B:
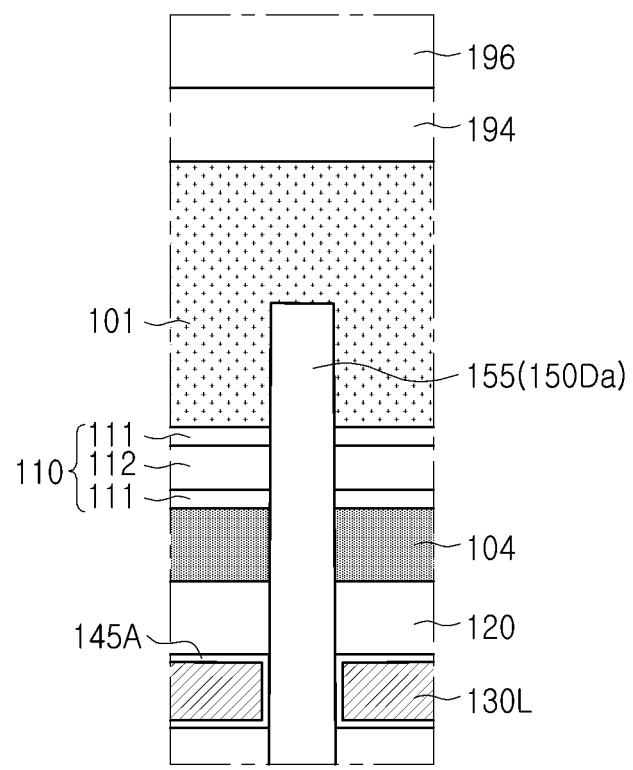

FIGS. 4A and 4B are a cross-sectional view illustrating a semiconductor device and an enlarged view illustrating a portion of a semiconductor device according to an example embodiment, illustrating region "C" in FIG. 4A.

Referring to FIGS. 4A and 4B, in a semiconductor device 100a, dummy contact structures 150Da may have an internal structure different from that of the input/output contact structures 150, and may have a different arrangement form.

Differently from the input/output contact structures 150, the dummy contact structures 150Da may not include the contact conductive layer 154 (see FIG. 3A) and may be filled with the dummy contact insulating layer 155. The dummy contact insulating layer 155 may include an insulating material. The internal structure of the dummy contact structures 150Da may be applied to the aforementioned example embodiment described with reference to FIGS. 2A to 3B.

In the example embodiment, the dummy contact structures 150Da may have a length or height different from those of the input/output contact structures 150, that is, for example, a length less than those of the input/output contact structures 150. Upper surfaces of the dummy contact structures 150Da may be disposed in the plate layer 101. For example, upper surfaces of the dummy contact structures 150Da may be disposed on substantially the same level as a level of upper surfaces of the channel structures CH, but an example embodiment thereof is not limited thereto.

The dummy contact structures 150Da in the example embodiment may be formed in a process different from the process of forming the input/output contact structures 150. For example, the contact holes in which the dummy contact structures 150Da are disposed may be formed separately from the contact holes in which the input/output contact structures 150 are disposed, or the contact holes in which the dummy contact structures 150Da are disposed may be formed together with the contact holes in which the input/output contact structures 150 are disposed and a deposition process may be performed in separate processes.

As described above, in example embodiments, the dummy contact structures 150Da may have an internal structure different from that of the input/output contact structures 150 and/or a disposition form different from that of the input/output contact structures 150 in the Z-direction.

Figure 5A:
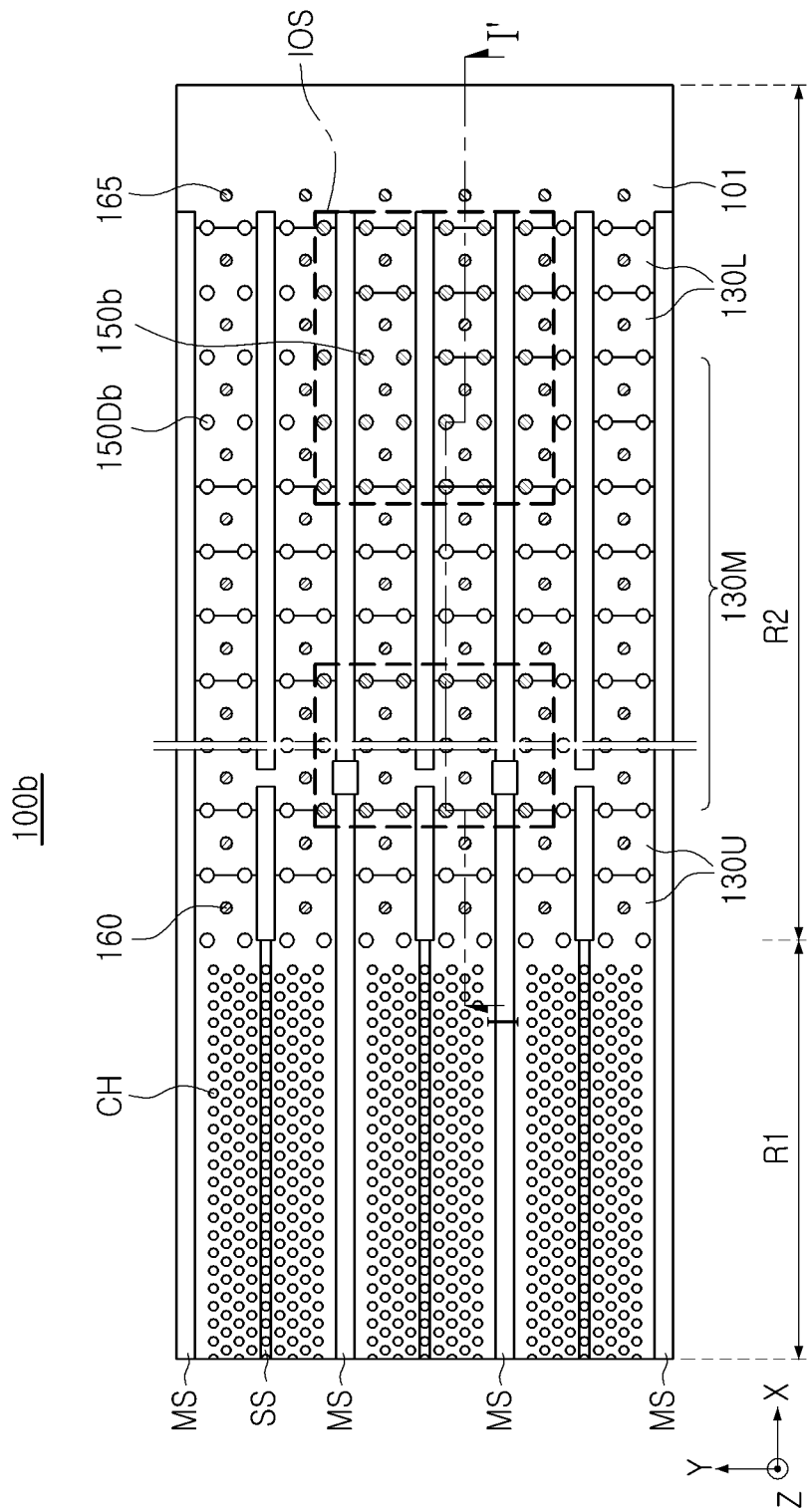
FIGS. 5A and 5B are a plan view (FIG. 5A) and a cross-sectional view (FIG. 5B) illustrating a semiconductor device according to an example embodiment of the present disclosure.
Figure 5B:
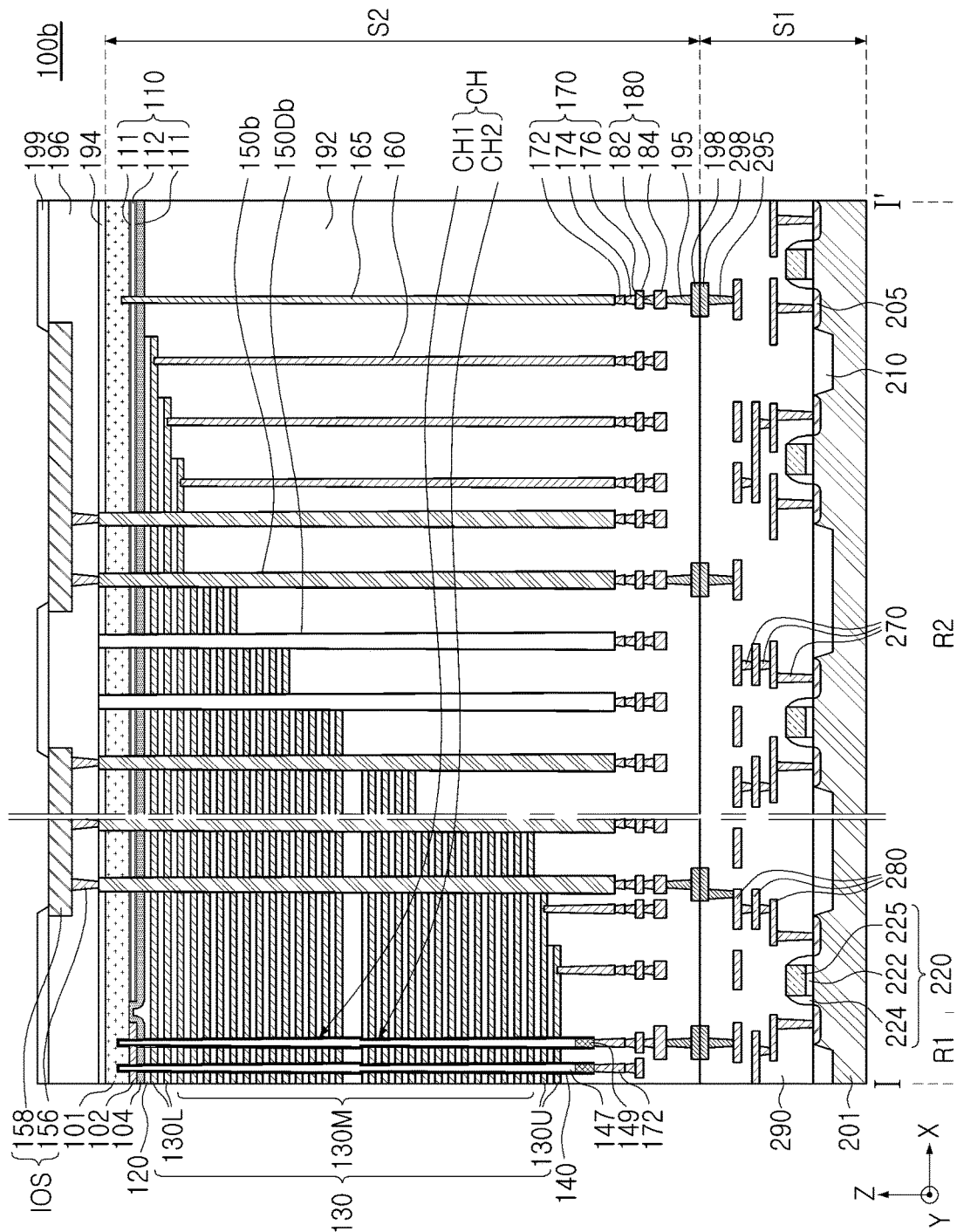

FIGS. 5A and 5B are a plan view and a cross-sectional view illustrating a semiconductor device according to an example embodiment.

Referring to FIGS. 5A and 5B, in a semiconductor device 100b, the input/output contact structures 150b and the dummy contact structures 150Db may be disposed to penetrate the ends of the gate electrodes 130 in the X-direction. For example, the input/output contact structures 150b and the dummy contact structures 150Db may be disposed on the ends (i.e., penetrate the gate electrodes 130 at or near end portions of the gate electrodes 130) in a region between the gate contacts 160 adjacent to each other in the X-direction, as illustrated in FIG. 5B.

The input/output contact structures 150b and the dummy contact structures 150Db may have a diameter relatively larger than in the example embodiment in FIGS. 2A and 2B. For example, the input/output contact structures 150b and the dummy contact structures 150Db may have a diameter equal to or larger than that of the gate contacts 160.

As described above, in example embodiments, the specific arrangement positions of the input/output contact structures 150b and the dummy contact structures 150Db on the plane and the diameters of the input/output contact structures 150b and the dummy contact structures 150Db may be varied. However, in example embodiments, the input/output contact structures 150b and the dummy contact structures 150Db may be disposed on the second region R2 and may be spaced apart from the gate contacts 160.

Figure 6:
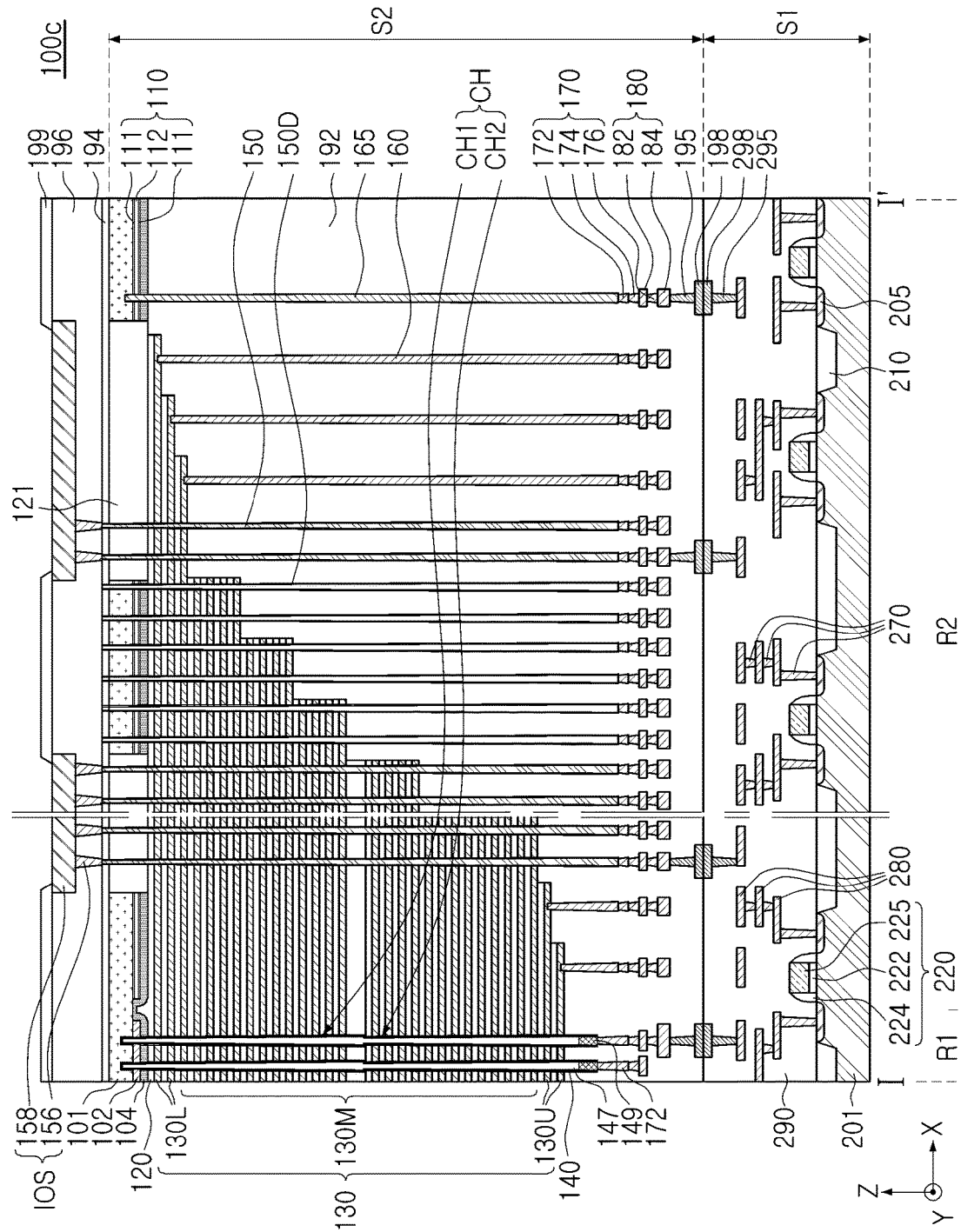
FIG. 6 is a cross-sectional view illustrating a semiconductor device according to an example embodiment of the present disclosure.

FIG. 6 is a cross-sectional view illustrating a semiconductor device according to an example embodiment.

Referring to FIG. 6, in a semiconductor device 100c, the second substrate structure S2 may further include through insulating layers 121 penetrating the plate layer 101. The through insulating layers 121 may be disposed to penetrate the plate layer 101, the horizontal insulating layer 110, and the second horizontal conductive layer 104 in the second region R2. The through insulating layers 121 may be disposed to surround the input/output contact structures 150 in a predetermined unit, respectively. For example, the through insulating layers 121 may be disposed below the input/output pads 158 to correspond to the input/output pads 158.

In some example embodiments, the through insulating layers 121 may also be disposed to surround the dummy contact structures 150D, and the size of each of the through insulating layers 121 and the arrangement form of the through insulating layers 121 may be varied in the example embodiments. In some example embodiments, the through insulating layer 121 may be further disposed in another region of the second region R2, such as, for example, on external sides of the gate electrodes 130. The upper surface of the through insulating layer 121 may be coplanar with the upper surface of the plate layer 101 or may be disposed on a level higher than a level of the upper surface of the plate layer 101. The through insulating layer 121 may include an insulating material, such as, for example, silicon oxide, silicon nitride, silicon carbide, or silicon oxynitride.

Figure 7:
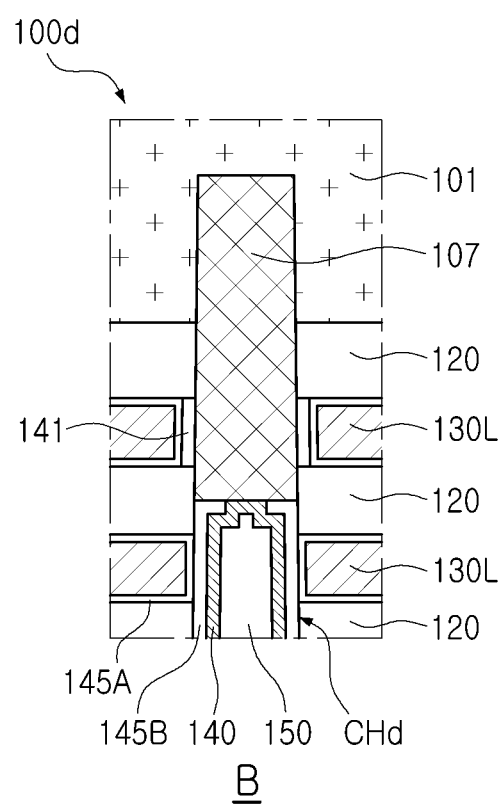
FIG. 7 is an enlarged view illustrating a portion of a semiconductor device according to an example embodiment of the present disclosure.

FIG. 7 is an enlarged view illustrating a portion of a semiconductor device according to an example embodiment, illustrating a region corresponding to FIG. 3B.

Referring to FIG. 7, in a semiconductor device 100d, the second substrate structure S2 may not include the first and second horizontal conductive layers 102 and 104 disposed on the lower surface of the plate layer 101, differently from the example embodiment in FIGS. 2A to 3B. Also, the channel structure CHd may further include an epitaxial layer 107.

The epitaxial layer 107 may be disposed on the lower surface of the plate layer 101 on the upper end of the channel structure CHd, and may be disposed on the side surface of the at least one gate electrode 130. The epitaxial layer 107 may be disposed in a recessed region of the plate layer 101. The lower surface of the epitaxial layer 107 may be disposed in a region between the gate electrodes 130 vertically adjacent to each other. For example, the lower surface of the epitaxial layer 107 may be disposed in a region between the lower gate electrodes 130L, but an example embodiment thereof is not limited thereto. The epitaxial layer 107 may be connected to the channel layer 140 through a lower surface. A gate insulating layer 141 may be further disposed in a region between the epitaxial layer 107 and the lower gate electrode 130L opposing the epitaxial layer 107.

FIGS. 8A to 8K are cross-sectional views illustrating a method of manufacturing a semiconductor device according to an example embodiment.

Figure 8A:
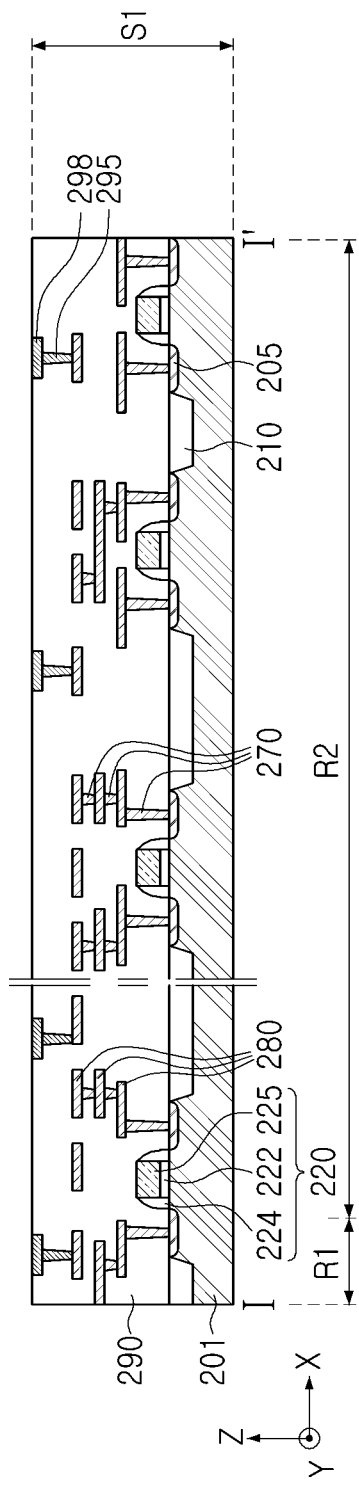

Referring to FIG. 8A, a first substrate structure S1 including circuit devices 220, first interconnection structures, and a first bonding structure may be formed on a substrate 201.

First, device isolation layers 210 may be formed in the substrate 201, and a circuit gate dielectric layer 222 and a circuit gate electrode 225 may be formed in order on the substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on both sidewalls of the circuit gate dielectric layer 222 and the circuit gate electrode 225. In example embodiments, the spacer layer 224 may include a plurality of layers. Thereafter, an ion implantation process may be performed to form the source/drain regions 205.

The circuit contact plugs 270 of the first interconnection structure and the first bonding vias 295 of the first bonding structure may be formed by partially forming a peripheral region insulating layer 290, partially removing the peripheral region insulating layer 290 by etching, and filling a conductive material therein. The circuit interconnection lines 280 of the first interconnection structure and the first bonding metal layers 298 of the first bonding structure may be formed by depositing a conductive material and patterning the conductive material, for example. The first bonding metal layers 298 may be formed such that upper surfaces thereof may be exposed through the peripheral region insulating layer 290.

The peripheral region insulating layer 290 may include a plurality of insulating layers. A portion of the peripheral region insulating layer 290 may be formed in each of the processes of forming the first interconnection structure and the first bonding structure. By this process, the first substrate structure S1 may be prepared.

Figure 8B:
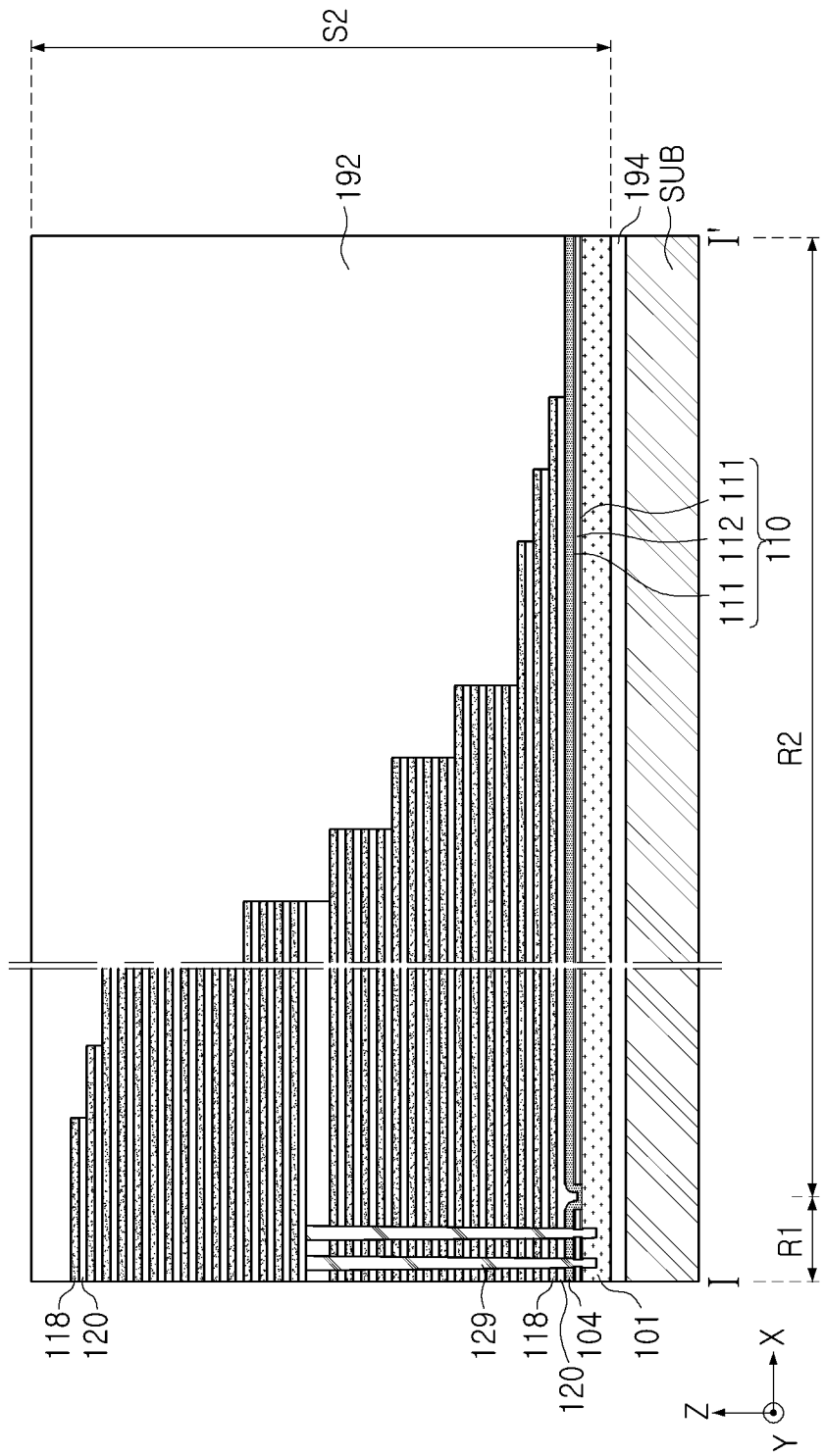

Referring to FIG. 8B, a process of manufacturing the second substrate structure S2 may start. First, a second cell region insulating layer 194 may be formed on a base substrate SUB, a plate layer 101, a horizontal insulating layer 110, and a second horizontal conductive layer 104 may be formed, sacrificial insulating layers 118 and interlayer insulating layers 120 may be alternately stacked, and thereafter, the channel sacrificial layers 129 may be formed.

The base substrate SUB may be removed through a subsequent process, and may be a semiconductor substrate such as silicon (S1). The second cell region insulating layer 194 may be formed to protect the plate layer 101 when the base substrate SUB is subsequently removed. The plate layer 101 may be formed as, for example, a polycrystalline silicon layer.

The horizontal insulating layer 110 may be formed by alternately stacking the first and second horizontal insulating layers 111 and 112 on the plate layer 101. The horizontal insulating layer 110 may be replaced with the first horizontal conductive layer 102 in FIG. 2B through a subsequent process in the first region R1. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the sacrificial insulating layers 118.

The second horizontal conductive layer 104 may be formed on the horizontal insulating layer 110, and may be in contact with the plate layer 101 in a region from which the horizontal insulating layer 110 is removed. Accordingly, the second horizontal conductive layer 104 may be bent along the ends of the horizontal insulating layer 110, may cover the ends, and may extend to the plate layer 101.

Thereafter, firstly, to form a lower stack structure, the sacrificial insulating layers 118 and the interlayer insulating layers 120 may be alternately arranged in a region in which the first channel structures CH1 (see FIG. 2B) are disposed. The sacrificial insulating layers 118 may be replaced with the gate electrodes 130 (see FIG. 2B) through a subsequent process. The sacrificial insulating layers 118 may be formed of a material etched with etch selectivity with respect to the interlayer insulating layers 120. For example, the interlayer insulating layer 120 may be formed of at least one of silicon oxide and silicon nitride, and the sacrificial insulating layers 118 may be formed of a material different from that of the interlayer insulating layer 120, selected from among silicon, silicon oxide, silicon carbide, and silicon nitride. In example embodiments, the thickness of the interlayer insulating layers 120 and the number of films forming the interlayer insulating layers 120 may be varied from the illustrated examples.

Thereafter, in the second region R2, a photolithography process and an etching process may be repeatedly performed for the sacrificial insulating layers 118 and the interlayer insulating layers 120 such that the upper sacrificial insulating layers 118 may extend less than the lower sacrificial insulating layers 118 in the second region R2. Accordingly, the sacrificial insulating layers 118 may form a staircase shape, as illustrated in FIG. 8B. In example embodiments, the sacrificial insulating layers 118 may be formed to have a relatively great thickness on the ends, and a relevant process may be further performed. Thereafter, a portion of the first cell region insulating layer 192 covering the lower stack structure of the sacrificial insulating layers 118 and the interlayer insulating layers 120 may be formed.

The channel sacrificial layers 129 may be formed by forming lower channel holes to penetrate the lower stack structure and depositing the channel sacrificial layer 129 material in the lower channel holes in the region corresponding to the first channel structures CH1. The channel sacrificial layers 129 may include, for example, polycrystalline silicon.

The upper multilayer structure may be formed on the lower multilayer structure in the same method as the method of forming the lower multilayer structure. Thereafter, upper channel holes may be formed to penetrate the upper stack structure and channel sacrificial layers may be further formed in the region corresponding to the second channel structures CH2 (see FIG. 2B).

In the example embodiment, the plate layer 101 may not be partially removed to form an input/output pad structure (IOS). Accordingly, as compared to the comparative example in which the plate layer 101 is partially removed to form the input/output pad structure IOS, a step may not be formed on the upper surface of the first cell region insulating layer 192, such that defects caused by the step may also be prevented.

Figure 8C:
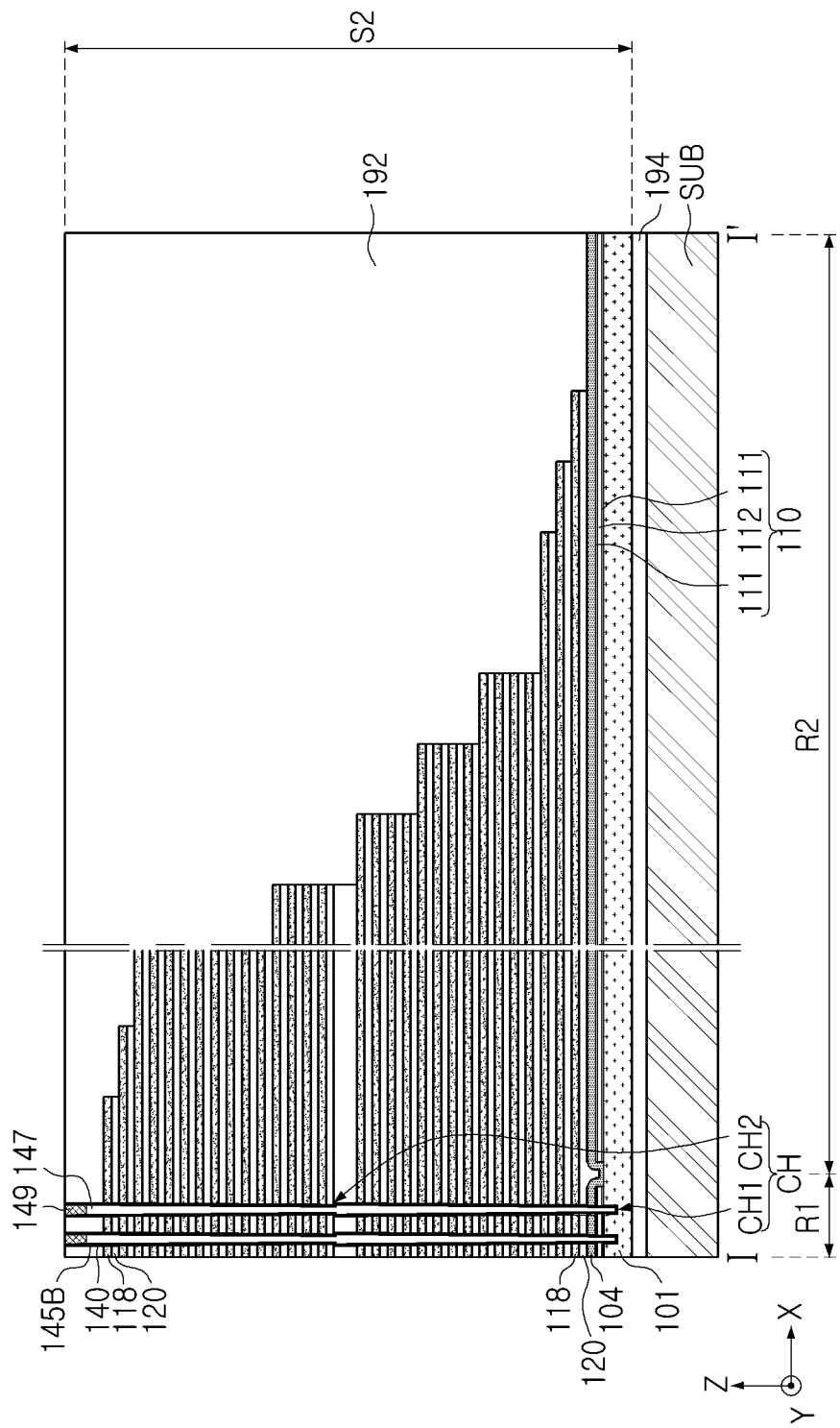

Referring to FIG. 8C, channel structures CH penetrating the stack structure of the sacrificial insulating layers 118 and the interlayer insulating layers 120 may be formed.

First, in the upper stack structure, a portion of the sacrificial insulating layers 118 and the interlayer insulating layers 120 may be removed, thereby forming an upper separation region SS (see FIG. 2A). An upper separation region SS may be formed by exposing the region in which the upper separation region SS are formed, removing a predetermined number of the sacrificial insulating layers 118 and the interlayer insulating layers 120 from the uppermost portion, and depositing an insulating material.

Thereafter, to form the channel structures CH, channel holes may be formed by removing the channel sacrificial layers 129. The channel structures CH including the first and second channel structures CH1 and CH2 may be formed by forming a second gate dielectric layer 145B, a channel layer 140, a channel filling insulating layer 147, and a channel pad 149 in order in each of the channel holes. The channel layer 140 may be formed on the second gate dielectric layer 145B in the channel structures CH. The channel filling insulating layer 147 may be formed to fill the channel structures CH, and may be an insulating material. However, in example embodiments, the space between the channel layers 140 may be filled with a conductive material instead of the channel filling insulating layer 147. The channel pads 149 may be formed of a conductive material, such as, for example, polycrystalline silicon.

Figure 8D:
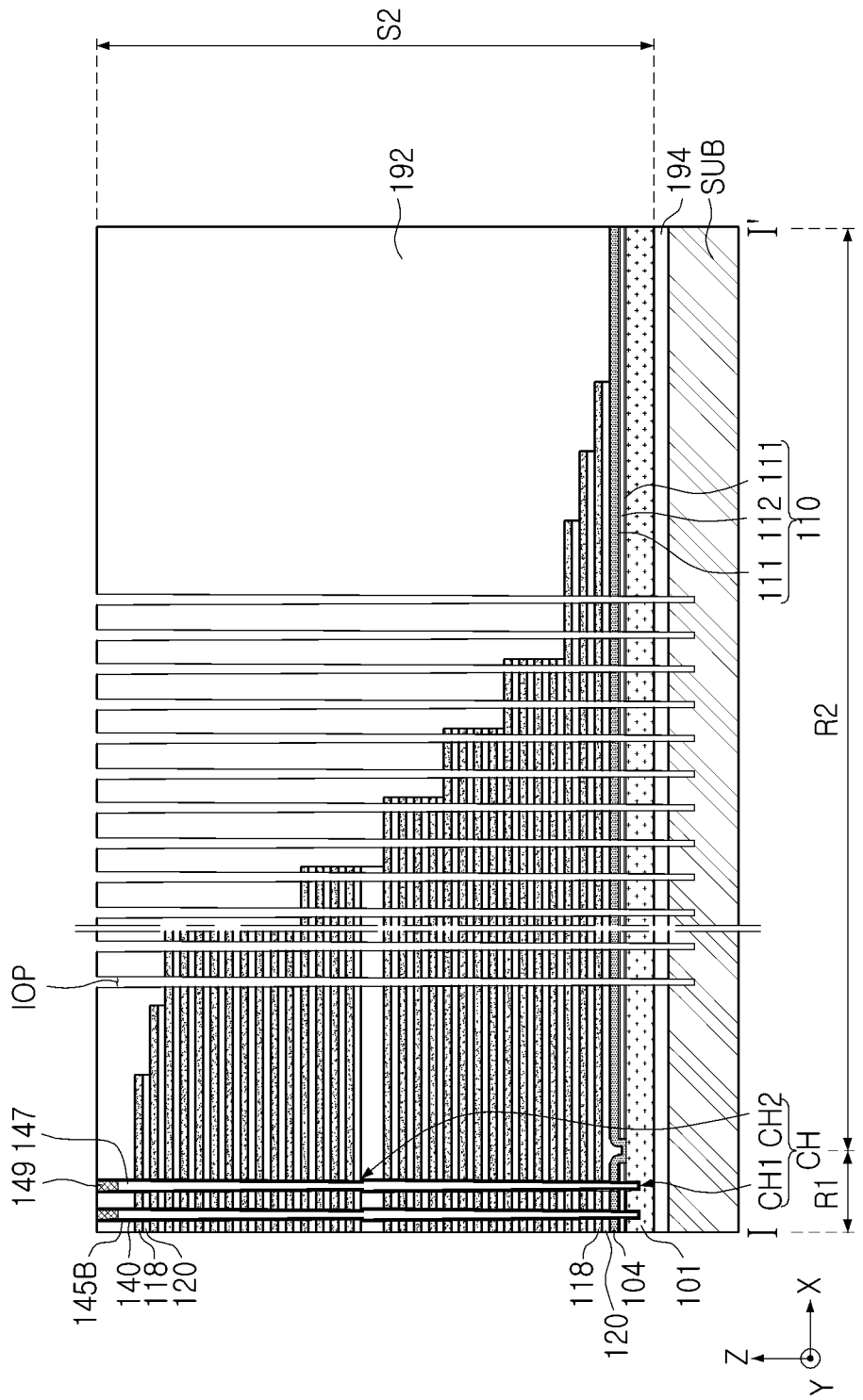

Referring to FIG. 8D, contact holes TOP penetrating the stack structure of the sacrificial insulating layers 118 and the interlayer insulating layers 120 and extending to the base substrate SUB may be formed.

Contact holes TOP may be formed in positions corresponding to the input/output contact structures 150 and the dummy contact structures 150D in FIG. 2B using a mask layer. The contact holes IOP may be formed to entirely penetrate the plate layer 101. The lower ends of the contact holes IOP may be disposed in the base substrate SUB, but an example embodiment thereof is not limited thereto.

Referring to FIG. 8E, contact insulating layers 152 may be formed in the contact holes IOP.

The contact insulating layers 152 may be formed on sidewalls of the contact holes IOP. The contact insulating layers 152 may be removed to not cover the bottom surfaces of the contact holes IOP. However, in this process, in example embodiments, the contact insulating layers 152 may be formed to cover the bottom surfaces of the contact holes IOP, and may be removed during a subsequent process described with reference to FIG. 8J.

Figure 8F:
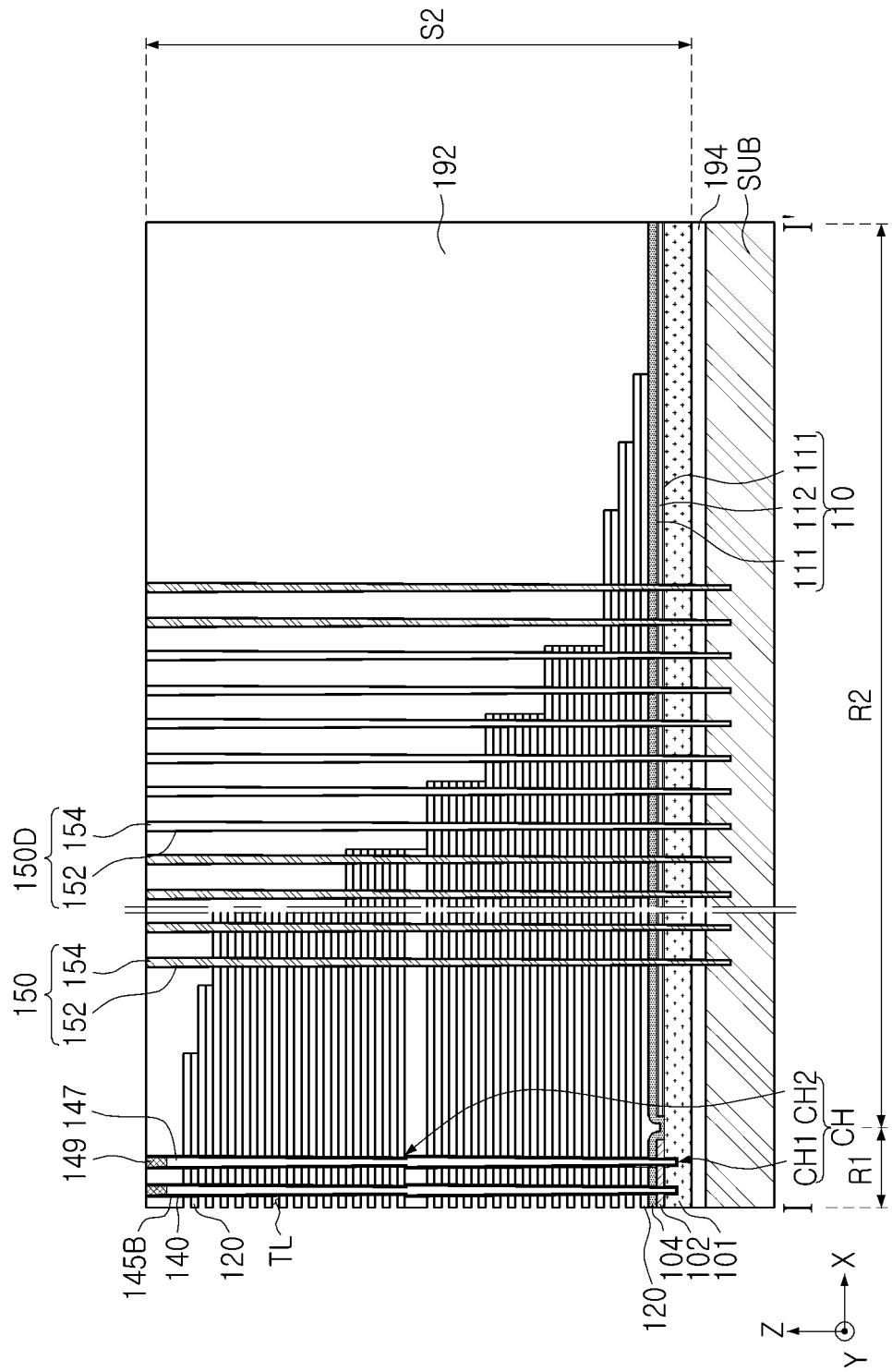

Referring to FIG. 8F, contact conductive layers 154 may be formed in the contact holes IOP, separate openings may be formed, the first horizontal conductive layer 102 may be formed, and the sacrificial insulating layers 118 may be removed through the openings, thereby forming tunnel portions TL.

First, the contact conductive layers 154 may be formed to fill the contact holes IOP on the contact insulating layers 152. Accordingly, input/output contact structures 150 and dummy contact structures 150D, each including the contact insulating layer 152 and the contact conductive layer 154, may be formed.

Thereafter, the openings may be formed in a region corresponding to the separation regions MS (see FIG. 2A), and may be formed in the form of a trench extending in the X-direction. The second horizontal insulating layer 112 may be exposed from the first region R1 by an etch-back process while forming sacrificial spacer layers in the openings. The exposed second horizontal insulating layer 112 may be selectively removed, and the first horizontal insulating layers 111 disposed above and below the second horizontal insulating layer 112 may be removed. The horizontal insulating layer 110 may be removed by, for example, a wet etching process. In the process of removing the first horizontal insulating layers 111, a portion of the second gate dielectric layer 145B exposed in the region from which the second horizontal insulating layer 112 is removed may also be removed. The first horizontal conductive layer 102 may be formed by depositing a conductive material in the region from which the horizontal insulating layer 110 is removed, and the sacrificial spacer layers may be removed from the openings. Through this process, the first horizontal conductive layer 102 may be formed in the first region R1, and the horizontal insulating layer 110 may remain in the second region R2.

Thereafter, the sacrificial insulating layers 118 may be selectively removed with respect to the interlayer insulating layers 120 using, for example, wet etching. Accordingly, tunnel portions TL may be formed between the interlayer insulating layers 120. In the state in which the sacrificial insulating layers 118 are removed, the stack structure of the interlayer insulating layers 120 may be supported by the channel structures CH in the first region R1, and may be supported by the input/output contact structures 150 and the dummy contact structures 150D in the second region R2.

Figure 8G:
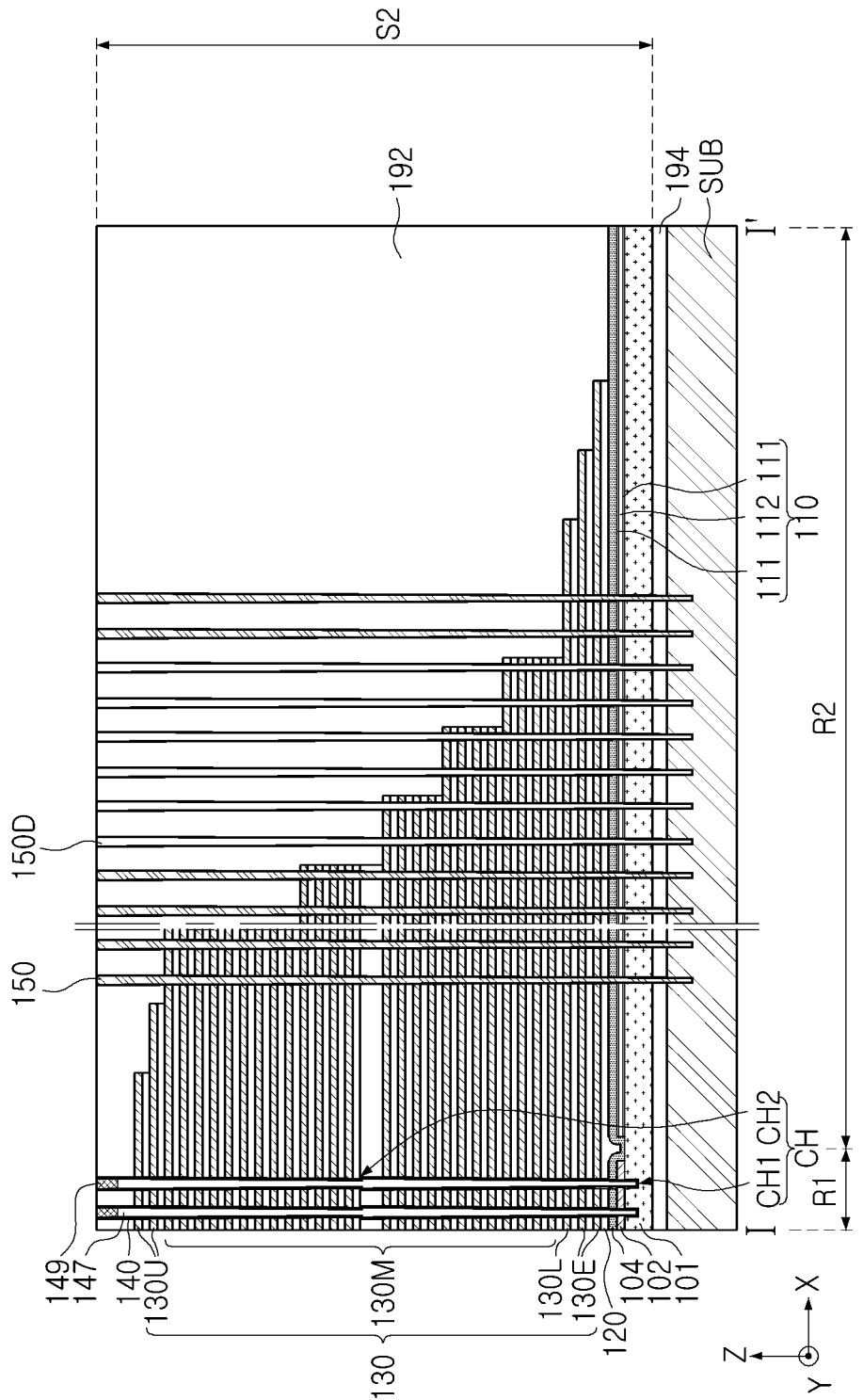

Referring to FIG. 8G, the gate electrodes 130 may be formed in the region from which the sacrificial insulating layers 118 are removed.

Before the gate electrodes 130 are formed, first gate dielectric layers 145A (see FIGS. 3A and 3B) may be formed preferentially. The first gate dielectric layers 145A may be formed to extend horizontally along the tunnel portions TL, and may be formed to cover the sidewalls of the channel structures CH, the input/output contact structures 150, and the dummy contact structures 150D, exposed through the tunnel portions TL.

The gate electrodes 130 may be formed by filling the tunnel portions TL with a conductive material. The gate electrodes 130 may include a metal, polycrystalline silicon, or a metal silicide material. Thereafter, the separation regions MS (see FIG. 2A) may be formed by filling the openings OP with an insulating material.

Figure 8H:
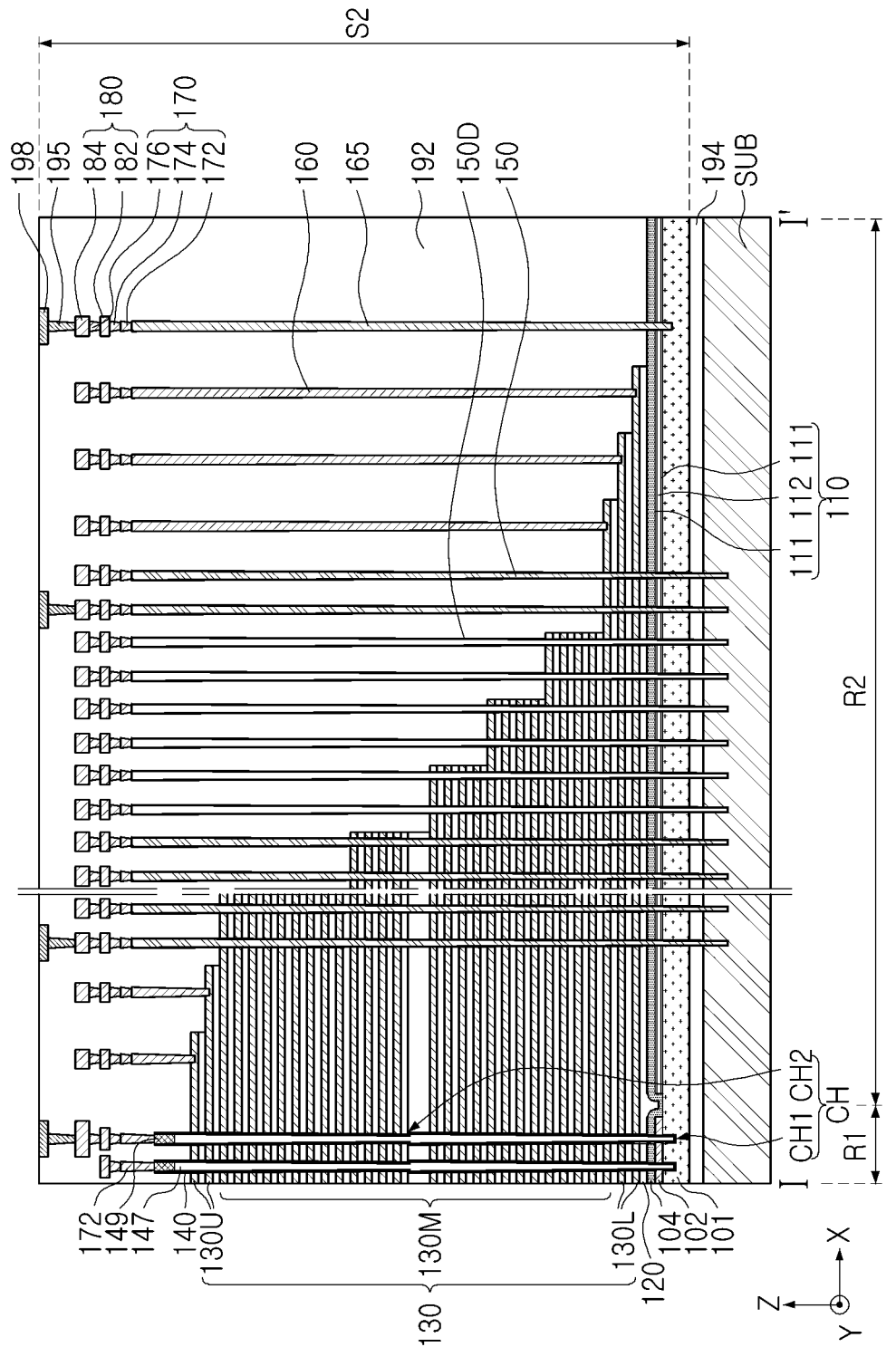

Referring to FIG. 8H, a second interconnection structure and a second bonding structure may be formed on the gate electrodes 130.

In the second interconnection structure, the gate contacts 160 and the substrate contact 165 may be formed by forming contact holes by etching the first cell region insulating layer 192 on the gate electrodes 130 and the plate layer 101 and filling the contact holes with a conductive material. The cell contact plugs 170 may be formed by etching the first cell region insulating layer 192 and depositing a conductive material on the channel pads 149, the gate contacts 160, and the substrate contact 165. The cell interconnection lines 180 may be formed by depositing and patterning a conductive material, or by forming a portion of an insulating layer forming the first cell region insulating layer 192, patterning the portion, and depositing a conductive material.

The second bonding vias 195 and the second bonding metal layers 198 forming the second bonding structure may be formed by further forming the first cell region insulating layer 192 on the cell interconnection lines 180 and partially removing the first cell region insulating layer 192. Upper surfaces of the second bonding metal layers 198 may be exposed from the first cell region insulating layer 192.

Figure 8I:
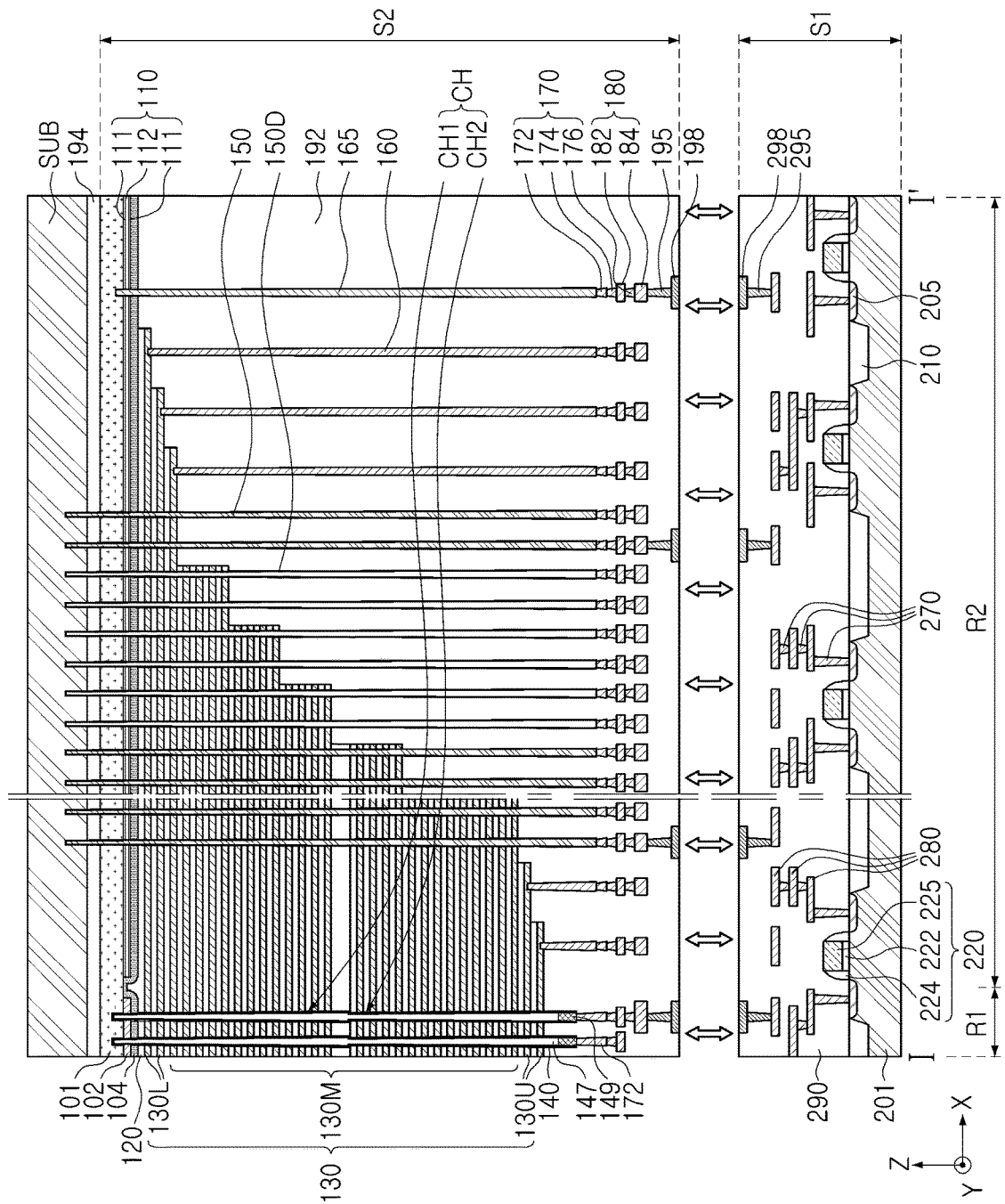

Referring to FIG. 8I, the first substrate structure S1 and the second substrate structure S2 may be bonded to each other.

The first substrate structure S1 and the second substrate structure S2 may be connected to each other by bonding the first bonding metals 298 to the second bonding metal layers 198 by annealing and/or pressing. Simultaneously, bonding insulating layers, which may be a portion of the peripheral region insulating layer 290 and the first cell region insulating layer 192, may be bonded to each other. The second substrate structure S2 may be turned over on the first substrate structure S1, the second bonding metal layers 198 may be directed downwardly, and bonding may be performed. In the drawings, it is illustrated that the second substrate structure S2 may be bonded in a mirror image of the structure illustrated in FIG. 8H.

The first substrate structure S1 and the second substrate structure S2 may be directly bonded to each other without an adhesive such as a separate adhesive layer therebetween. In example embodiments, before bonding, a surface treatment process such as hydrogen plasma treatment may be further performed on the upper surface of the first substrate structure S1 and the lower surface of the second substrate structure S2 to strengthen bonding strength.

Figure 8J:
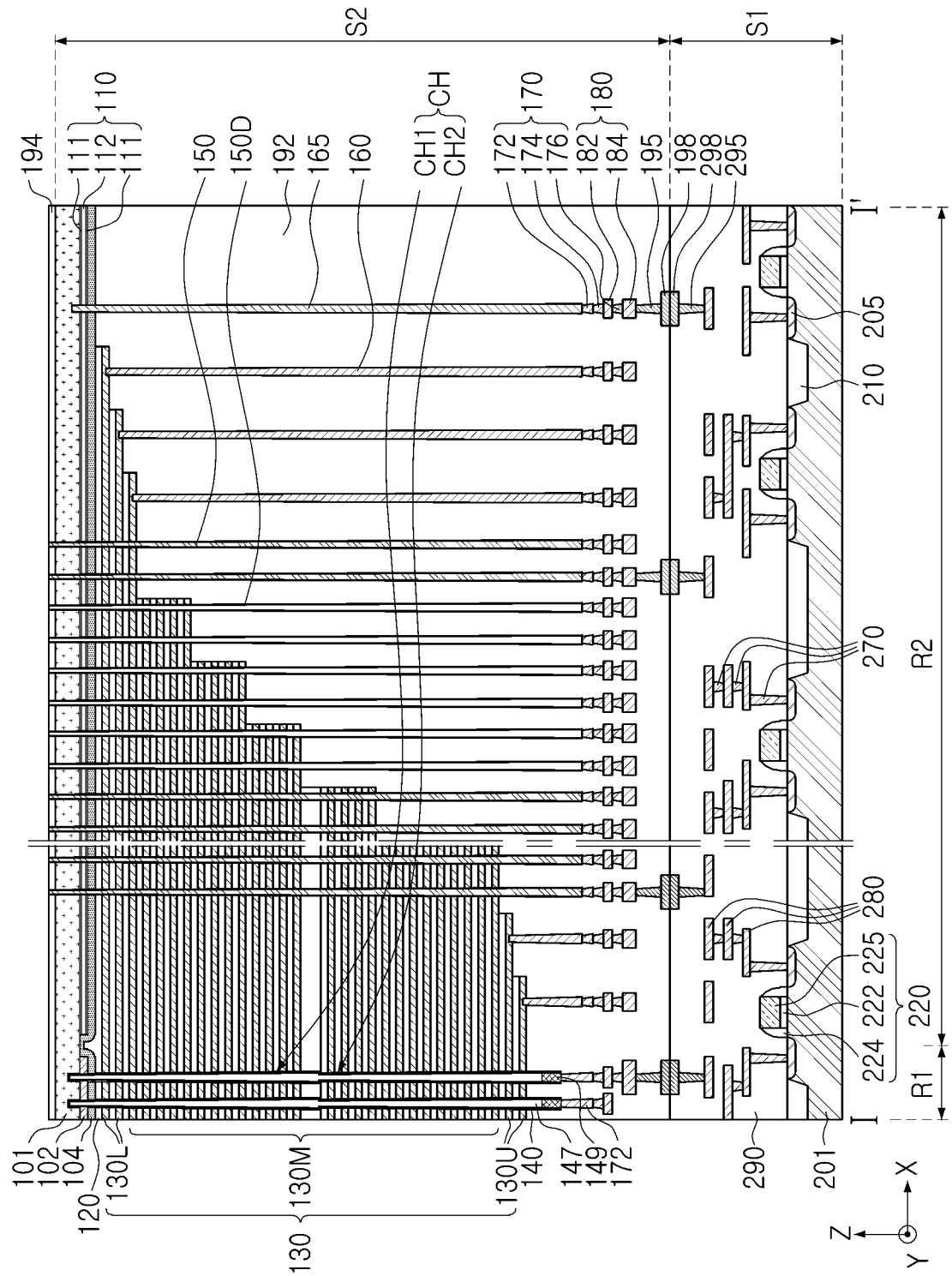

Referring to FIG. 8J, the base substrate SUB of the second substrate structure S2 may be removed from the bonding structure of the first and second substrate structures S1 and S2.

A portion of the base substrate SUB may be removed from the upper surface by a polishing process such as a grinding process, and the remaining portion may be removed by an etching process such as wet etching. By removing the base substrate SUB of the second substrate structure S2, the total thickness of the semiconductor device may be reduced. When the base substrate SUB is removed, the second cell region insulating layer 194 may also be partially removed, and upper ends of the input/output contact structures 150 and the dummy contact structures 150D may be exposed.

Figure 8K:
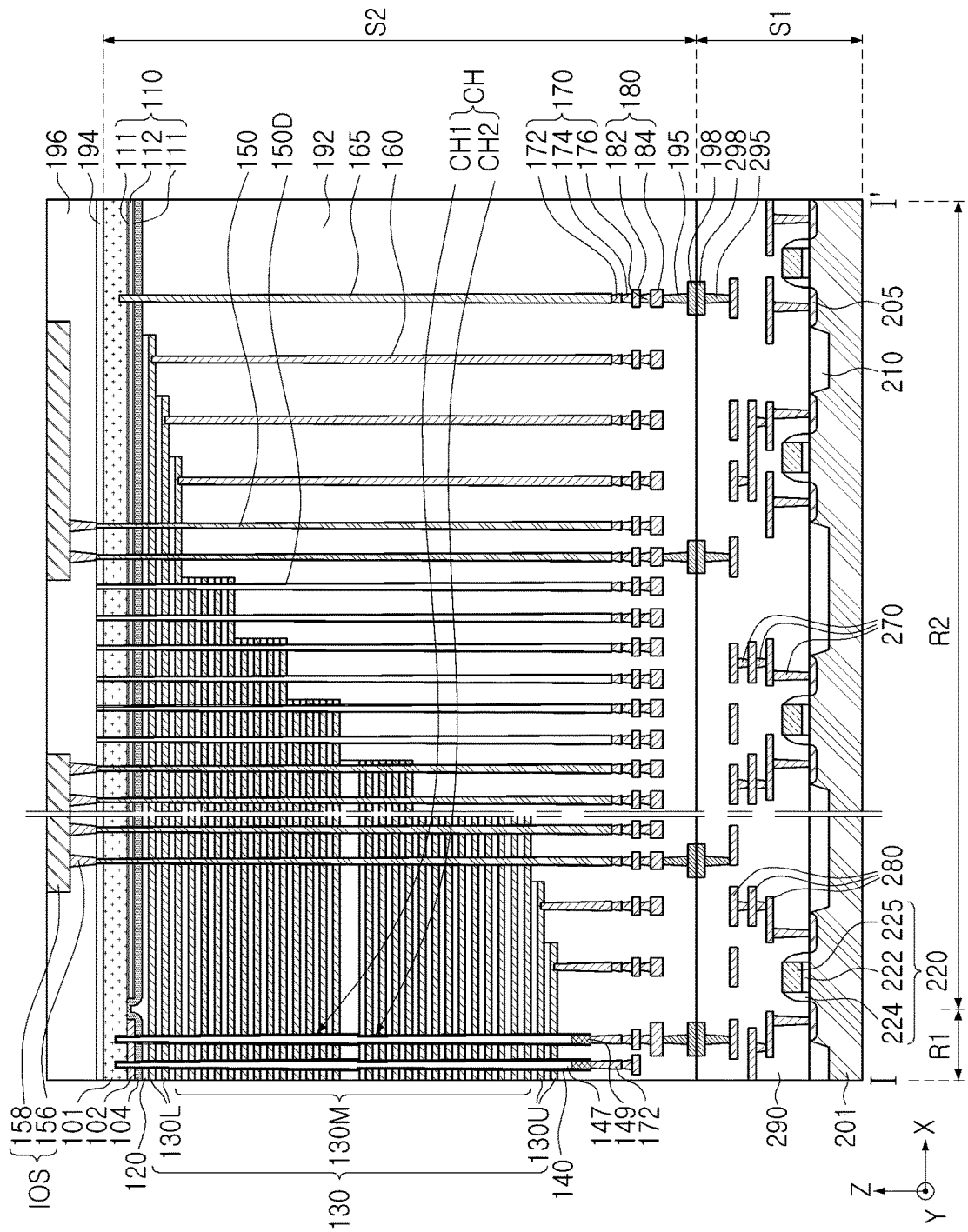

Referring to FIG. 8K, input/output pad structures IOS may be formed on the input/output contact structures 150 and the dummy contact structures 150D.

First, the input/output vias 156 may be formed by forming a portion of the third cell region insulating layer 196, forming via holes, and filling the via holes with a conductive material. The input/output pads 158 may be formed by depositing and patterning a conductive material on the input/output vias 156.

Thereafter, referring to FIG. 2B together, a passivation layer 199 may be formed on the upper surfaces of the input/output pads 158 and the third cell region insulating layer 196, thereby manufacturing the semiconductor device 100 in FIG. 2B.

Figure 9:
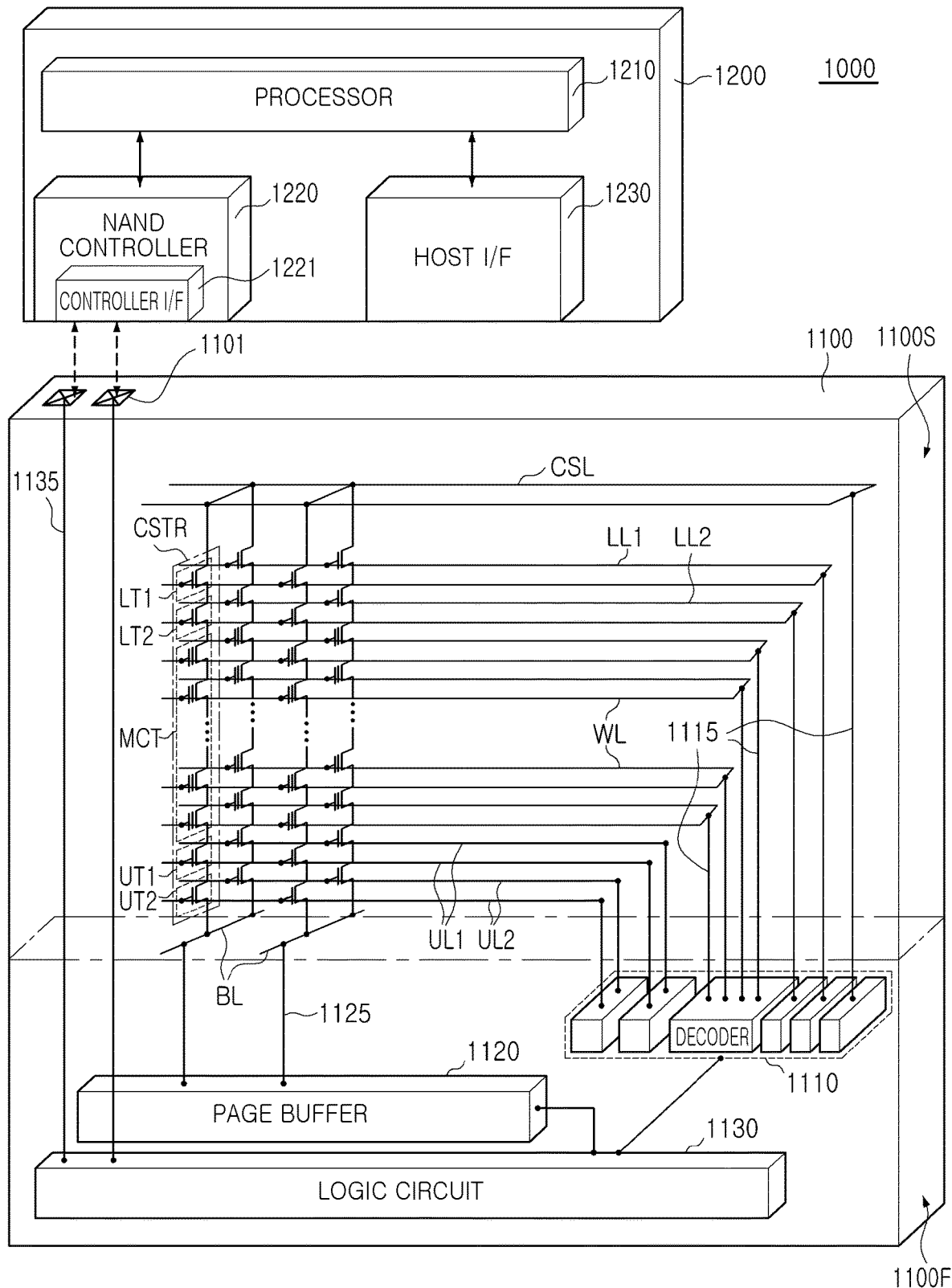
FIG. 9 is a view illustrating a data storage system including a semiconductor device according to an example embodiment of the present disclosure.

FIG. 9 is a view illustrating a data storage system including a semiconductor device according to an example embodiment.

Referring to FIG. 9, a data storage system 1000 may include a semiconductor device 1100 and a controller 1200 electrically connected to the semiconductor device 1100.

The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 7, for example. The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input/output connection interconnection 1135 extending from the first semiconductor structure 1100F to the second semiconductor structure 1100S. In example embodiments, the input/output connection line 1135 may include the input/output contact structures 150 in FIG. 2B.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 10:
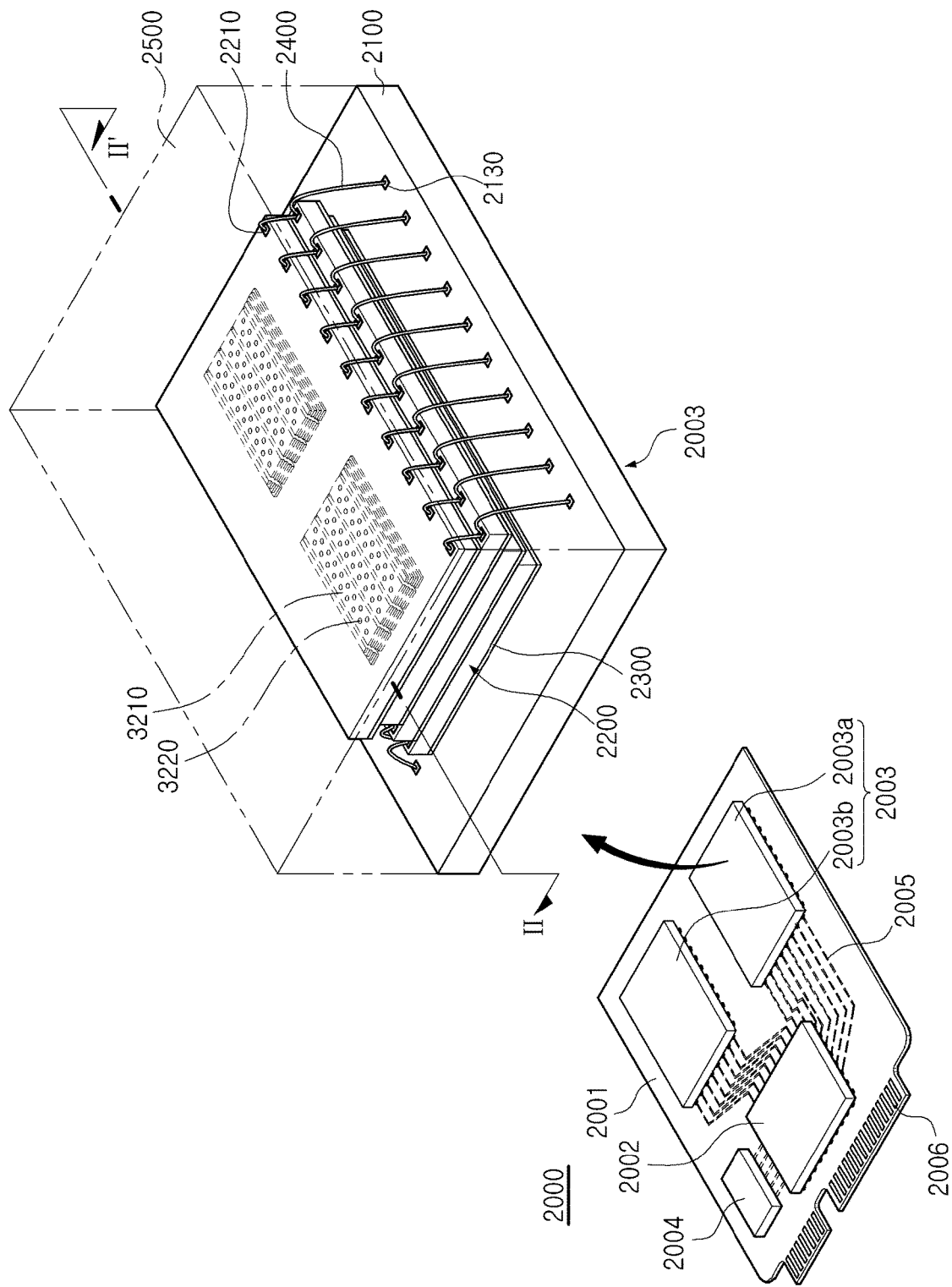
FIG. 10 is a perspective view illustrating a data storage system including a semiconductor device according to an example embodiment of the present disclosure.

FIG. 10 is a perspective view illustrating a data storage system including a semiconductor device according to an example embodiment.

Referring to FIG. 10, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit substrate including the package upper pads 2130. Each of the semiconductor chips 2200 may include an input and output pad 2210. The input and output pad 2210 may correspond to the input and output pad 1101 in FIG. 9. Each of the semiconductor chips 2200 may include gate stack structures 3210 and channel structures 3220. Each of the semiconductor chips 2200 may include the semiconductor device described with reference to FIGS. 1 to 7.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 11:
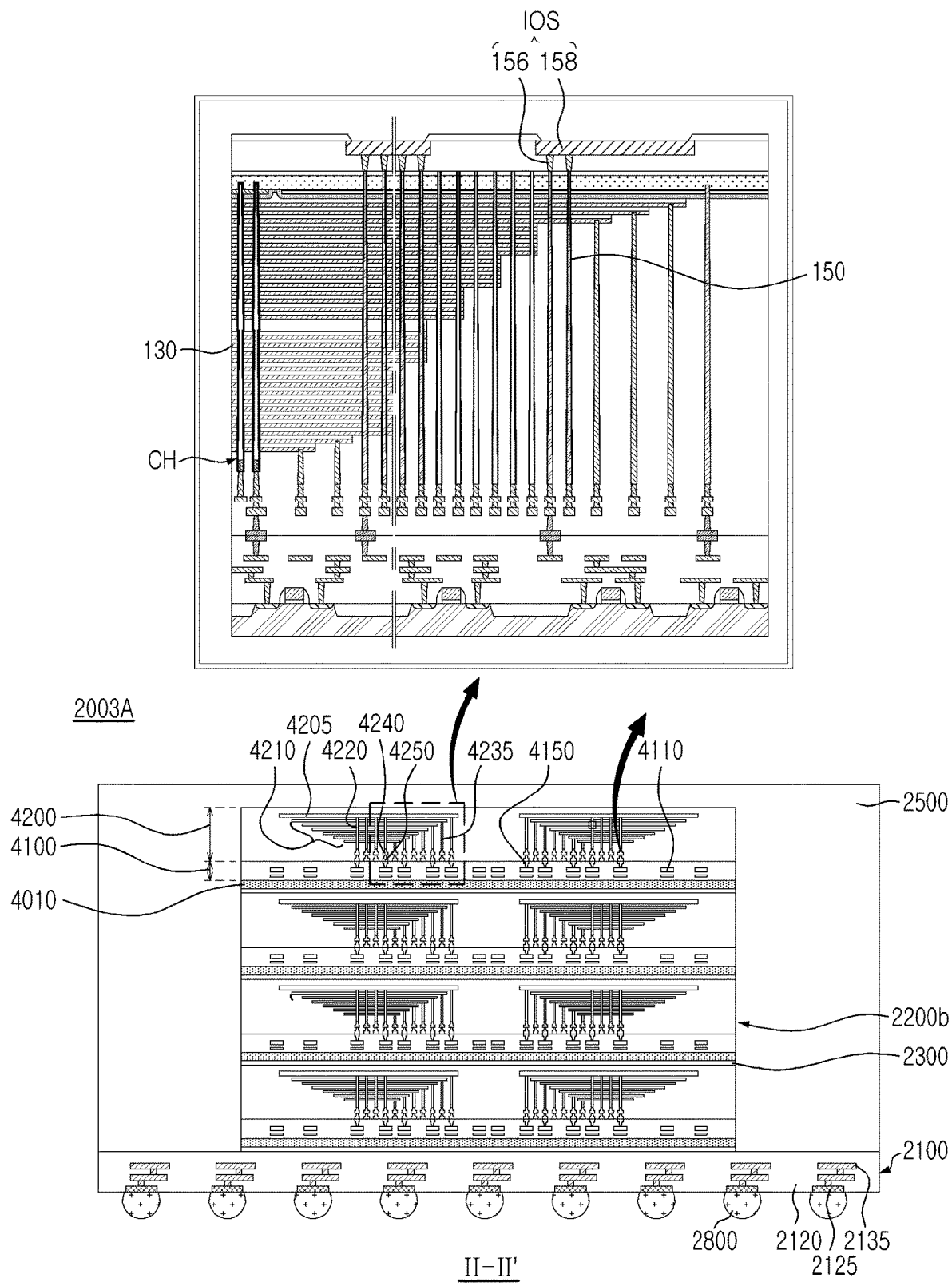
FIG. 11 is a cross-sectional view illustrating a semiconductor package according to an example embodiment of the present disclosure.

FIG. 11 is a cross-sectional view illustrating a semiconductor device according to an example embodiment. FIG. 11 illustrates an example embodiment of the semiconductor package 2003 in FIG. 10, and illustrates the semiconductor package 2003 in FIG. 10 taken along line II-II'.

Referring to FIG. 11, in the semiconductor package 2003A, each of the semiconductor chips 2200b may include a semiconductor substrate 4010, a first structure 4100 on the semiconductor substrate 4010, and a second structure 4200 bonded to the first structure 4100 on the first structure 4100 by a wafer bonding method.

The first structure 4100 may include a peripheral circuit region including the peripheral wiring 4110 and the first bonding structures 4150. The second structure 4200 may include a common source line 4205, a gate stack structure 4210 disposed between the common source line 4205 and the first structure 4100, channel structures 4220 and a separation region 4230 penetrating the gate stack structure 4210, and second bonding structures 4250 electrically connected to the word lines WL (see FIG. 9) of the memory channel structures 4220 and the gate stack structure 4210, respectively. For example, the second bonding structures 4250 may be electrically connected to the memory channel structures 4220 and the word lines WL through the bit lines 4240 electrically connected to the memory channel structures 4220 and the gate contacts 160 (see FIG. 2B) electrically connected to the word lines WL. The first bonding structures 4150 of the first structure 4100 and the second bonding structures 4250 of the second structure 4200 may be in contact with and bonded to each other. Bonded portions of the first bonding structures 4150 and the second bonding structures 4250 may be formed of, for example, copper (Cu).

As illustrated in the enlarged view, the second structure 4200 may include input/output contact structures 150 extending by penetrating the gate electrodes 130 in the region in which the gate electrodes 130 extend by different lengths, and connected to the input/output pad structures IOS.

The semiconductor chips 2200b may be electrically connected to each other by connection structures 2400 (see FIG. 10) in the form of bonding wires. However, in example embodiments, the semiconductor chips in a single semiconductor package, such as the semiconductor chips 2200b, may be electrically connected to each other by a connection structure including a through electrode TSV.

According to the aforementioned example embodiments, by disposing input/output contact structures to be adjacent to gate contacts in a structure in which two or more substrate structures are bonded to each other, a semiconductor device having improved integration density and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
  a first substrate structure comprising a substrate, circuit devices on the substrate, a first interconnection structure electrically connected to the circuit devices, and first bonding metal layers on the first interconnection structure; and
  a second substrate structure on and electrically connected to the first substrate structure, wherein the second substrate structure comprises:
    a plate layer comprising a first region and a second region;
    gate electrodes stacked below the plate layer and spaced apart from each other in a first direction that is perpendicular to a lower surface of the plate layer, wherein the gate electrodes extend in a second direction in the second region, wherein the second direction is perpendicular to the first direction, and wherein at least some of the gate electrodes have different lengths;

channel structures in the first region, the channel structures penetrating through the gate electrodes in the first direction, wherein each channel structure comprises a channel layer;

input/output contact structures in the second region, the input/output contact structures penetrating through the plate layer and the gate electrodes in the first direction, wherein each input/output contact structure comprises a contact conductive layer;

input/output pad structures in the second region and electrically connected to the input/output contact structures;

a second interconnection structure below the second region, wherein the second interconnection structure comprises gate contacts electrically connected to the gate electrodes, wherein the gate contacts extend in the first direction, and wherein the input/output contact structures are in a region between the gate contacts and are spaced apart from each other in the second direction; and second bonding metal layers below the second interconnection structure and electrically connected to the first bonding metal layers.

2. The semiconductor device of claim 1, wherein upper ends of the input/output contact structures penetrate through the plate layer, and wherein lower ends of the input/output contact structures are electrically connected to the second interconnection structure below the plate layer.

3. The semiconductor device of claim 1, wherein a level of upper surfaces of the input/output contact structures is higher than a level of upper surfaces of the channel structures.

4. The semiconductor device of claim 1, wherein the input/output contact structures are spaced apart from the gate contacts.

5. The semiconductor device of claim 1, wherein each of the input/output contact structures further includes a contact insulating layer that extends around a side surface of the contact conductive layer.

6. The semiconductor device of claim 5, wherein the contact insulating layer extends in the first direction between the contact conductive layer and the gate electrodes.

7. The semiconductor device of claim 1, wherein the input/output pad structures are spaced apart from the channel structures in the second direction.

8. The semiconductor device of claim 1, wherein each of the input/output pad structures comprises:

an input/output via on a respective input/output contact structure; and an input/output pad on the input/output via.

9. The semiconductor device of claim 8, further comprising a passivation layer having an opening that exposes at least a portion of the input/output pad.

10. The semiconductor device of claim 1, wherein the second substrate structure further comprises dummy contact structures in the second region, wherein the dummy contact structures penetrate through the gate electrodes in the first direction, wherein the dummy contact structures are electrically separated from the input/output pad structures.

11. The semiconductor device of claim 10, wherein an internal structure of each of the dummy contact structures and an internal structure of each of the input/output contact structures are the same.

12. The semiconductor device of claim 10, wherein the channel structures, the input/output contact structures, and the dummy contact structures each have respective different internal structures.

13. The semiconductor device of claim 1, wherein at least some of the input/output contact structures penetrate through end portions of at least some of the gate electrodes.

14. The semiconductor device of claim 1, wherein the second substrate structure further comprises a through insulating layer that penetrates through the plate layer and extends around an outer side of the input/output contact structures.

15. The semiconductor device of claim 1, wherein the second substrate structure further comprises:

a first horizontal conductive layer on the gate electrodes and electrically connected to the channel layer of each of the channel structures below the first region;

a horizontal insulating layer on the gate electrodes below a portion of the second region; and a second horizontal conductive layer on a lower surface of the first horizontal conductive layer and a lower surface of the horizontal insulating layer, and wherein the input/output contact structures further penetrate through the horizontal insulating layer and the second horizontal conductive layer.

16. A semiconductor device, comprising:

a first substrate structure comprising a substrate, circuit devices on the substrate, and first bonding metal layers electrically connected to the circuit devices; and a second substrate structure on and electrically connected to the first substrate structure, wherein the second substrate structure comprises:

a plate layer comprising a first region and a second region;

gate electrodes stacked below the plate layer and spaced apart from each other in a first direction that is perpendicular to a lower surface of the plate layer, wherein the gate electrodes have different lengths and extend in a second direction in the second region, wherein the second direction is perpendicular to the first direction;

channel structures in the first region, the channel structures penetrating through the gate electrodes in the first direction, wherein each channel structure comprises a channel layer;

input/output contact structures in the second region, the input/output contact structures penetrating through the plate layer and the gate electrodes in the first direction, wherein each input/output contact structure comprises a contact conductive layer;

dummy contact structures in the second region, wherein the dummy contact structures penetrate through the gate electrodes in the first direction, and wherein an internal structure of each of the dummy contact structures and an internal structure of each of the input/output contact structures are the same; and second bonding metal layers below the gate electrodes and electrically connected to the first bonding metal layers, wherein a level of upper surfaces of the input/output contact structures is higher than a level of upper surfaces of the channel structures.

17. The semiconductor device of claim 16, wherein a level of lower surfaces of the input/output contact structures is lower than a level of lower surfaces of the channel structures.

18. The semiconductor device of claim 16, wherein the internal structure of each of the input/output contact structures is different from an internal structure of the channel structures.

19. A data storage system, comprising:
a semiconductor storage device comprising a first substrate structure comprising circuit devices and first bonding metal layers, a second substrate structure comprising channel structures and second bonding metal layers electrically connected to the first bonding metal layers, and an input/output pad electrically connected to the circuit devices; and
a controller electrically connected to the semiconductor storage device through the input/output pad, the controller configured to control the semiconductor storage device,
wherein the second substrate structure further comprises:
a plate layer comprising a first region and a second region;
gate electrodes stacked below the plate layer and spaced apart from each other in a first direction that is perpendicular to a lower surface of the plate layer, wherein the gate electrodes extend in a second direction in the second region, wherein the second direction is perpendicular to the first direction, and wherein at least some of the gate electrodes have different lengths;
gate contacts in the second region, wherein the gate contacts are electrically connected to the gate electrodes and extend in the first direction; and
input/output contact structures in the second region, the input/output contact structures penetrating through the plate layer and the gate electrodes in the first direction, wherein each input/output contact structure comprises a contact conductive layer,
wherein the input/output contact structures are in a region between the gate contacts and are spaced apart from each other in the second direction, and
wherein a level of upper surfaces of the input/output contact structures is higher than a level of upper surfaces of the channel structures.

20. The data storage system of claim 19, wherein
the input/output contact structures are spaced apart from an adjacent channel structure by a first distance, and are spaced apart from an adjacent gate contact by a second distance smaller than the first distance.

* * * * *